US012690499B2

(12) United States Patent
Bonafede et al.

(10) Patent No.: US 12,690,499 B2
(45) Date of Patent: Jul. 21, 2026

(54) CONTROLLING ADHESIVE REFLOW FOR TRANSFER PRINTING

(71) Applicant: Daktronics, Inc., Brookings, SD (US)

(72) Inventors: Salvatore Bonafede, Chapel Hill, NC (US); Carl Ray Prevatte, Jr., Raleigh, NC (US); Christopher Andrew Bower, Raleigh, NC (US); Brook Raymond, Cary, NC (US); Matthew Alexander Meitl, Durham, NC (US); Ronald S. Cok, Rochester, NY (US); Andrew Tyler Pearson, Durham, NC (US)

(73) Assignee: Daktronics, Inc., Brookings, SD (US)

( * ) Notice: Subject to any disclaimer, the term of this patent is extended or adjusted under 35 U.S.C. 154(b) by 436 days.

(21) Appl. No.: 18/362,918

(22) Filed: Jul. 31, 2023

(65) Prior Publication Data

US 2025/0046751 A1      Feb. 6, 2025

(51) Int. Cl.
*H10W 90/00* (2026.01)
*H10W 72/00* (2026.01)
*H10W 72/30* (2026.01)

(52) U.S. Cl.
CPC ...... *H10W 90/00* (2026.01); *H10W 72/01353* (2026.01); *H10W 72/01357* (2026.01); *H10W 72/073* (2026.01); *H10W 72/07311* (2026.01); *H10W 72/07331* (2026.01); *H10W 72/07338* (2026.01); *H10W 72/07353* (2026.01); *H10W 72/334* (2026.01); *H10W 90/722* (2026.01);
(Continued)

(58) Field of Classification Search
CPC .................. H10W 72/07337; H10W 72/07338
See application file for complete search history.

(56) References Cited

U.S. PATENT DOCUMENTS

| | | | |
|---|---|---|---|
| 7,622,367 B1 | 11/2009 | Nuzzo et al. | |
| 7,943,491 B2 | 5/2011 | Nuzzo et al. | |
| 8,506,867 B2 | 8/2013 | Menard | |

(Continued)

OTHER PUBLICATIONS

Cok, R. S. et al., Inorganic light-emitting diode displays using micro-transfer printing, Journal of the SID, 25(10):589-609, (2017).

*Primary Examiner* — Errol V Fernandes
(74) *Attorney, Agent, or Firm* — Schwegman Lundberg & Woessner, P.A.

(57) ABSTRACT

Methods of making a printed structure include providing a target substrate, coating the target substrate with an uncured adhesive, disposing a component on the uncured adhesive, processing the uncured adhesive with or without a pattern, and curing the uncured adhesive. Some embodiments include having a target-substrate contact pad on the target substrate, disposing a post component on the uncured adhesive over the target-substrate contact pad, the post component having an electrical connection extending from the post component toward the target-substrate contact pad, disposing a non-post component on the uncured adhesive laterally displaced from the post component, pattern-wise processing the uncured adhesive so that a first portion of the uncured adhesive adjacent to the post component is not processed and a second portion of the uncured adhesive adjacent to the non-post component is processed, reflowing the unprocessed first portion of the uncured adhesive, and curing the uncured adhesive.

20 Claims, 20 Drawing Sheets

(52)  U.S. Cl.

CPC ........ *H10W 90/724* (2026.01); *H10W 90/732*
(2026.01); *H10W 90/734* (2026.01)

(56)                      References Cited

U.S. PATENT DOCUMENTS

| | | | |
|---|---|---|---|
| 8,722,458 | B2 | 5/2014 | Rogers et al. |
| 8,889,485 | B2 | 11/2014 | Bower |
| 10,103,069 | B2 | 10/2018 | Bower et al. |
| 10,153,256 | B2 | 12/2018 | Cok et al. |
| 10,163,735 | B2 | 12/2018 | Bower et al. |
| 10,224,460 | B2 | 3/2019 | Bower et al. |
| 10,468,363 | B2 | 11/2019 | Prevatte et al. |
| 10,796,971 | B2 | 10/2020 | Cok et al. |
| 11,024,608 | B2 | 6/2021 | Meitl et al. |
| 11,387,153 | B2 | 7/2022 | Cok et al. |
| 11,393,730 | B2 | 7/2022 | Cok et al. |
| 11,483,937 | B2 | 10/2022 | Bower et al. |
| 11,540,398 | B2 | 12/2022 | Bower et al. |
| 2013/0187258 | A1* | 7/2013 | Lu ....................... H10W 74/012 |
| | | | 257/621 |
| 2015/0318255 | A1* | 11/2015 | Karhade ............. H10W 74/012 |
| | | | 257/737 |
| 2016/0093600 | A1 | 3/2016 | Bower et al. |
| 2020/0052152 | A1* | 2/2020 | Cok ..................... H10P 74/232 |

* cited by examiner

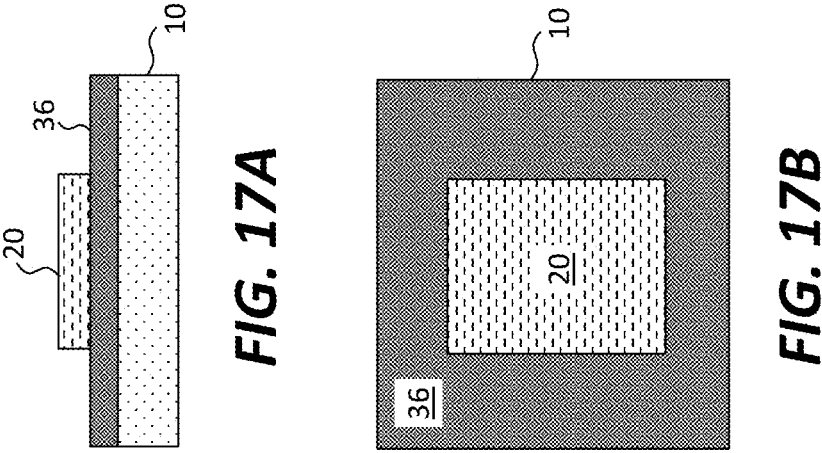
*FIG. 17A*
*FIG. 17B*
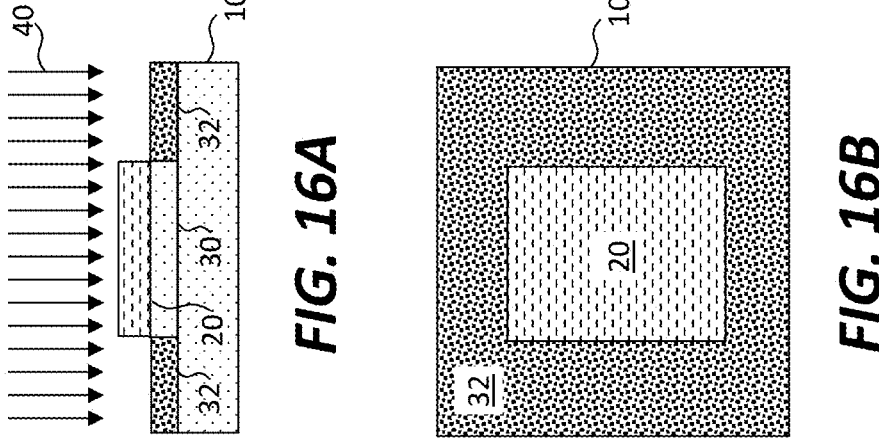
*FIG. 16A*
*FIG. 16B*

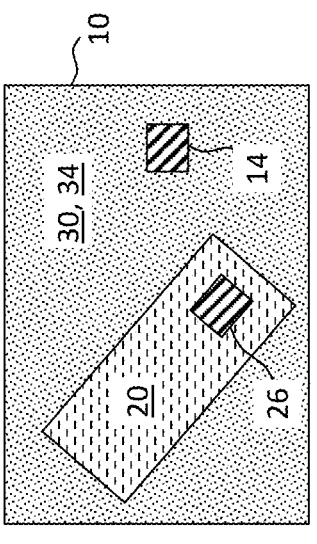
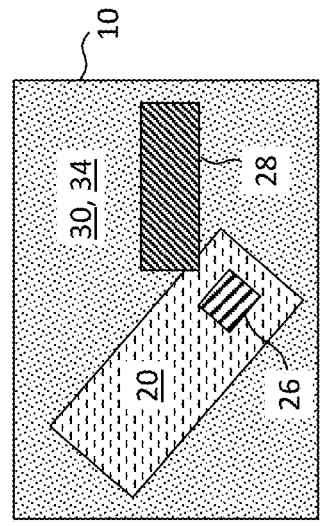
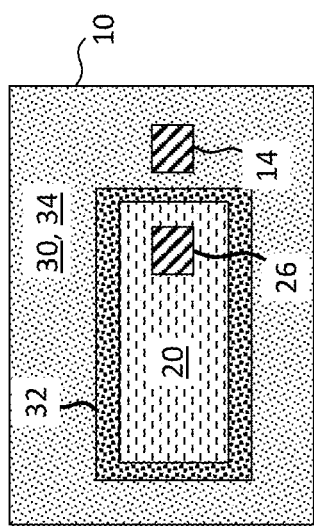
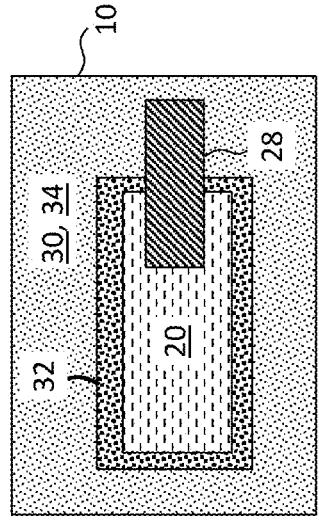
*FIG. 18A*
*FIG. 18B*

1

CONTROLLING ADHESIVE REFLOW FOR TRANSFER PRINTING

TECHNICAL FIELD

The present disclosure relates to micro-transfer printing components from a source wafer to a target substrate with improved adhesion, registration, and electrical connection.

BACKGROUND

Micro-transfer printing can be used to transfer very small components from a source substrate to a target substrate. In examples of these methods, small integrated circuits are formed on a native semiconductor source wafer. The small unpackaged integrated circuits, or chiplets, are released from the native source wafer by etching a layer formed beneath the circuits. A viscoelastic stamp is pressed against the native source wafer and the process side of the chiplets is adhered to individual stamp posts. As the stamp is retracted from the source, one or more tethers holding the device to the source wafer are severed, transferring the devices to the stamp. The chiplets on the stamp are then pressed against a destination substrate or backplane with the stamp and adhered to the destination substrate or backplane. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane. Other methods for transferring active components from one substrate to another are described in U.S. Pat. No. 7,943,491, entitled Pattern transfer printing by kinetic control of adhesion to an elastomeric stamp.

Often target substrates are coated with an adhesive to enhance the adhesion between the chiplet on the stamp to the target substrate. The target substrate is coated, e.g., by spin or spray coating, with the adhesive. The stamp, controlled by a micro-transfer printer, then presses the chiplet against the adhesive on the target substrate to adhere the chiplet to the target substrate, and is removed, leaving the chiplet on the target substrate.

U.S. Pat. Nos. 10,103,069 and 10,163,735, both entitled Pressure-Activated Electrical Interconnection by Micro-Transfer Printing by Bower et al. teaches a method of electrically connecting chiplets with connection posts to electrical connection pads on a target substrate by micro-transfer printing the chiplets onto the target substrate with the chiplet connection posts in alignment with the electrical contacts. A resin is disposed between the chiplet and the target substrate. If a chiplet is faulty, the resin is reflowed and another chiplet is printed to the target substrate to provide a functional component.

U.S. Pat. Nos. 10,796,971, 11,393,730, and 11,387,153 all entitled Pressure-Activated Electrical Interconnection with Additive Repair by Cok et al. teach that reflowing an adhesive resin can reduce the volume between a component and target substrate, drawing the component closer to the target substrate, and embedding any connection post more firmly into an electrical connection pad.

U.S. Pat. Nos. 11,483,937 and 11,540,398 both entitled Methods of Making Printed Structures by Bower et al. teach transfer printing a component onto an adhesive layer on a target substrate and processing the adhesive to fill or reduce a volume between the component and the target substrate. There is an on-going need, therefore, for methods, structures, and materials for adhering components to a target substrate and to provide reliable electrical interconnections between a chiplet and electrical connection pads on a target substrate enabled by micro-transfer printing.

SUMMARY

The present disclosure provides, inter alia, structures, materials, and methods that enable improved electrical connections between components with connection posts and electrical target-substrate contact pads disposed on the target substrate and improved registration between a printed component and a desired spatial location on the target substrate.

In some embodiments and according to the present disclosure, a method of making a printed structure can comprise disposing (e.g., printing such as micro-transfer printing) a first component to a target substrate coated with an uncured adhesive, disposing (e.g., printing such as micro-transfer printing) a second component to the target substrate, pattern-wise processing the uncured adhesive so that a first portion of the uncured adhesive adjacent to the first component is not processed and a second portion of the uncured adhesive adjacent to the second component is processed, reflowing the unprocessed first portion of the uncured adhesive, and curing (e.g., hard curing) the uncured adhesive. The first and second components can be disposed in any temporal order.

The processing step can comprise exposure to electromagnetic radiation, such as ultraviolet radiation, to release a catalyst in the uncured adhesive, e.g., in the exposed second portion of the adhesive. Processing the second portion of the uncured adhesive can comprise exposing the second portion of the adhesive to electromagnetic radiation through a mask. According to embodiments, processing the second portion of the adhesive diminishes a capacity of the second portion of the adhesive to reflow. In some embodiments reflowing the first portion of the adhesive can move the first component closer to the target substrate. In some embodiments, curing (e.g., hard curing) the adhesive can move the first component closer to the target substrate (e.g., such that the electrical connection is in electrical contact with the target-substrate contact pad) and moves the second component closer to the target substrate. Some embodiments of the present disclosure comprise removing exposed adhesive that is not between the first component and the target substrate and is not between the second component and the target substrate (e.g., by performing a field etch or blanket etch prior to curing or after curing).

The target substrate can comprise a target-substrate contact pad. The first component can be a post component that comprises an electrical connection extending from the post component toward the target-substrate contact pad. The electrical connection can comprise or be one or more posts e.g., connection posts such as electrically conductive connection posts comprising an electrical conductor such as a metal. In some embodiments, the electrical connection (e.g., connection post) is in contact with the target-substrate contact pad after (e.g., only after) the curing. In some embodiments, the electrical connection (e.g., connection post) is in contact with the target-substrate contact pad after (e.g., only after) the reflow. In some embodiments, the electrical connection (e.g., connection post) is in contact with the target-substrate contact pad before the reflow.

The second component can be a component (e.g., a non-post component) that does not comprise a post such as one or more connection posts. The second component can be laterally displaced from the first component with respect to the target substrate.

The reflow step can be a separate step from the hard-cure step. For example, the reflow step can comprise heating the uncured adhesive to a reflow temperature from a cool temperature such as room temperature, followed by a cooling step, for example to room temperature, followed by a hard-cure step comprising heating the adhesive to a hard-cure temperature greater than the reflow temperature. In some embodiments, the reflow step can be followed immediately by a hard-cure step without an intervening cooling step. The reflow step can be done over a reflow time period and the hard-cure step can be done over a hard-cure time period longer than the reflow time period. In embodiments, the adhesive is substantially held at a reflow temperature for a period of time before the hard-cure step.

According to embodiments of the present disclosure, a method of making a printed structure comprises providing a target substrate having a target-substrate contact pad, coating the target substrate with an uncured adhesive, disposing a post component (e.g., a first component) on the uncured adhesive over the target-substrate contact pad, the post component having an electrical connection extending from the post component toward the target-substrate contact pad, disposing a non-post component (e.g., a second component) on the uncured adhesive laterally displaced from the post component, pattern-wise processing the uncured adhesive so that a first portion of the uncured adhesive adjacent to the post component is not processed and a second portion of the uncured adhesive adjacent to the non-post component is processed, reflowing the unprocessed first portion of the uncured adhesive, and curing the uncured adhesive.

In some embodiments, processing the second portion of the uncured adhesive comprises exposing the second portion of the adhesive to electromagnetic radiation through a mask. In some embodiments, processing the second portion of the uncured adhesive comprises releasing a catalyst in the exposed second portion of the adhesive. In some embodiments, processing the second portion of the adhesive diminishes the capacity of the second portion of the adhesive to reflow. In some embodiments, reflowing the first portion of the adhesive moves the post (first) component closer to the target substrate. According to embodiments of the present disclosure, hard-curing the adhesive moves the post component closer to the target substrate so that the electrical connection is in electrical contact with the target-substrate contact pad and can also move the non-post component closer to the target substrate.

According to embodiments of the present disclosure, disposing the post component (e.g., the first component) comprises micro-transfer printing the post component onto or into the adhesive over the target substrate. According to embodiments of the present disclosure disposing the non-post component (e.g., the second component) comprises micro-transfer printing the non-post component onto or into the adhesive over the target substrate.

In some embodiments, the post component (e.g., the first component) has a lateral dimension no greater than 200 microns (e.g., no greater than 100 microns, no greater than 50 microns, no greater than 20 microns, no greater than 10 microns, no greater than 5 microns, no greater than 2 microns, or no greater than 1 micron). In some embodiments, the non-post component (e.g., the second component) has a lateral dimension no greater than 200 microns (e.g., no greater than 100 microns, no greater than 50 microns, no greater than 20 microns, no greater than 10 microns, no greater than 5 microns, no greater than 2 microns, or no greater than 1 micron).

In some embodiments, the post component (e.g., the first component) comprises a fractured or separated tether. In some embodiments, the non-post component (e.g., the second component) comprises a fractured or separated tether.

In some embodiments, the second portion of the adhesive at least partially laterally surrounds the non-post component, laterally surrounds the non-post component, forms a perimeter around the non-post component, forms at least a portion of a perimeter around the non-post component, or laterally interposes between the post component and the non-post component.

According to embodiments of the present disclosure, a printed structure comprises a target substrate, uncured adhesive disposed over the target substrate, a post component (e.g., a first component) disposed on the uncured adhesive over the target-substrate contact pad, and a non-post component (e.g., a second component) disposed on the uncured adhesive and laterally displaced from the post component. In embodiments, a first portion of the uncured adhesive adjacent to the post component is not processed and a second portion of the uncured adhesive adjacent to the non-post component is processed. In embodiments, the target substrate comprises a target-substrate contact pad, the uncured adhesive is disposed over the target-substrate contact pad, and the first component comprises an electrical connection extending from the first component toward the target-substrate contact pad.

In some embodiments, the processed second portion of the uncured adhesive has a reduced capacity to reflow compared to the first portion of the uncured adhesive. In some embodiments, the processed second portion of the uncured adhesive laterally surrounds or partially surrounds the non-post component. In some embodiments, the processed second portion of the uncured adhesive forms a perimeter or a partial perimeter around the non-post component. In some embodiments, the processed second portion of the uncured adhesive includes or comprises a released catalyst.

According to some embodiments, the first portion of the uncured adhesive is reflowed on a side of the post component to a first height and the second portion of the uncured adhesive is reflowed on a side of the non-post component to a second height that is less than the first height. In some embodiments, a first portion of the uncured adhesive between the post component and the target substrate or adjacent to the post component is thicker than a second portion of the uncured adhesive between the non-post component and the target substrate or adjacent to the non-post component. In some embodiments, the uncured adhesive has a thickness over the target substrate that is no greater than one micron (e.g., no greater than five hundred nm, two hundred fifty nm, one hundred nm, sixty nm, fifty nm, thirty nm, twenty nm, ten nm, or five nm).

In some embodiments, the post component is non-native to the target substrate. In some embodiments, the non-post component is non-native to the target substrate. A non-native component is formed on a source substrate separate, independent, and distinct from the target substrate and is transferred from the source substrate to the target substrate.

According to some embodiments, a method of making a printed structure comprises providing a target substrate, coating the target substrate with an uncured adhesive, disposing (e.g., printing such as micro-transfer printing or transferring such as dry transferring) a component on the uncured adhesive, processing the uncured adhesive, and curing (e.g., hard curing) the uncured adhesive. Processing the uncured adhesive can comprise exposing the uncured adhesive to electromagnetic radiation so that the uncured adhesive is less susceptible to reflow. Processing the uncured adhesive can comprise releasing a catalyst in the adhesive or cross linking the adhesive so that the adhesive is less susceptible to reflow. Processing the uncured adhesive can comprise processing only a portion of the adhesive, for example adhesive adjacent to the component. Some embodiments comprise reflowing the uncured adhesive after processing the adhesive. Some embodiments comprise hard curing the uncured adhesive after processing the adhesive. In embodiments of the present disclosure, the processed uncured adhesive laterally surrounds or forms a perimeter around the component. In some embodiments of the present disclosure, processing the uncured adhesive does not hard cure the adhesive. In embodiments of the present disclosure, processing the uncured adhesive prevents substantial movement of the component during curing the uncured adhesive.

Some embodiments of the present disclosure provide methods, devices, and structures that enable micro-transfer printing components from a native source wafer onto a non-native target substrate with improved electrical connections and registration.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 2A to 7B are successive structures, according to illustrative embodiments of the present disclosure in which each numbered figure A and B are a cross section and top view, respectively, of each of the successive structures;

FIGS. 16A and 16B are a cross section and top view, respectively, of a component on a processed adhesive layer on a target substrate, according to illustrative embodiments of the present disclosure;

FIGS. 17A and 17B are a cross section and top view, respectively, of a component on a hard-cured adhesive layer on a target substrate, according to illustrative embodiments of the present disclosure;

FIG. 18A is a plan view of a component on a target substrate after reflow and before thin-film interconnection (upper) and after thin-film interconnection (lower) for a component disposed with a processed, uncured adhesive according to illustrative embodiments of the present disclosure;

FIG. 18B is a plan view of a component on a target substrate after reflow and before thin-film interconnection (upper) and after thin-film interconnection (lower) for a component disposed with an unprocessed, uncured adhesive useful in understanding embodiments of the present disclosure;

Figure 1A:
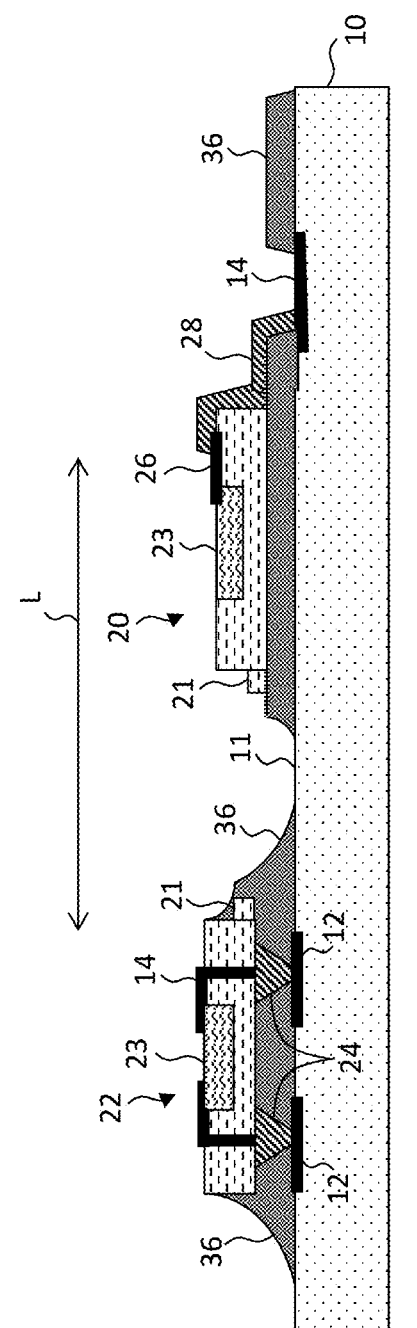
FIGS. 1A and 1B are cross sections of printed structures, according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale.

DETAILED DESCRIPTION OF CERTAIN EMBODIMENTS

Certain embodiments of the present disclosure are directed toward methods of printing (e.g., micro-transfer printing) a component from a component source wafer onto a target substrate coated with an adhesive, and to related printed structures. The component can be transfer printed with a visco-elastic stamp under the control of an opto-mechatronic printer. Some embodiments provide improved electrical connections between component connection posts and target-substrate contact pads disposed on the target substrate and improved registration between a printed component and a desired location on the target substrate.

Figure 1B:
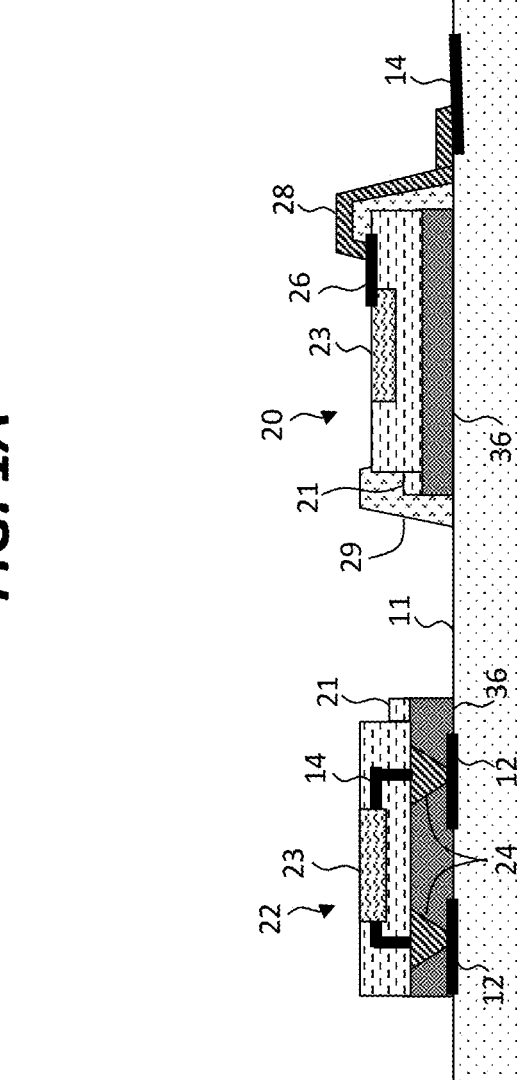
Figure 10:
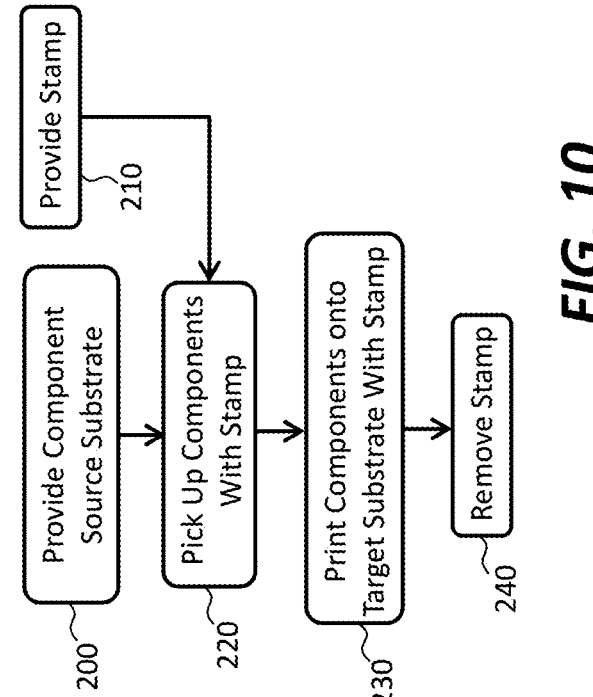
FIGS. 9 and 10 are flow diagrams illustrating methods according to illustrative embodiments of the present disclosure.

As shown in the cross section of FIG. 1A and the flow diagram of FIG. 10, according to embodiments of the present disclosure, a component 20 suspended over a component source wafer by a component tether 21 provided in step 200 can be micro-transfer printed in step 220 from the component source wafer to a target substrate 10 using a transfer printer, for example a micro-transfer printer, using a stamp (e.g., a visco-elastic stamp) provided in step 210. Under the control of the micro-transfer printer, component 20 is transfer printed onto target substrate 10 in step 230 by contacting the stamp to component 20 on the component source wafer, adhering component 20 to the stamp, removing component 20 from the component source wafer thereby separating or breaking (e.g., fracturing) component tether 21, and contacting component 20 to a layer of uncured adhesive 30 on target-substrate surface 11 of a target substrate 10 to adhere component 20 to uncured adhesive layer 30 (not shown in FIGS. 1A, 1B). The stamp can be removed in step 240. In some embodiments, component circuit 23 in component 20 can be electrically connected to a component contact pad 26 or to connection posts 24 with wires 14. Components 20 and component circuit 23 can be electrically connected to target-substrate contact pads 12 or wires 14. Uncured adhesive layer 30 can be cured to form a cured adhesive layer 36, as shown in FIGS. 1A and 1B.

As shown in FIG. 1A, in some embodiments, connection posts 24 disposed on a side of a post component 22 adjacent to target substrate 10 can form sharp spikes that poke through a cured adhesive layer 36 into target-substrate contact pads 12 (e.g., connection posts 24 can extend through cured adhesive layer 36 and pierce target-substrate contact pads 12) to form an electrical connection between connection posts 24 and target-substrate contact pads 12. Curing this adhesive layer causes the adhesive layer to shrink and to form an electrical connection between connection posts 24 and target-substrate contact pads 12. Connection posts 24 (e.g., spikes) can have a distal end with an area smaller than an area of a proximal end, e.g., connection posts 24 can be sharp or have a sharp point. In some embodiments, component contact pads 26 electrically connected to component circuit 23 can be disposed on a side of a non-post component 20 opposite target substrate 10 and can be connected to wires 14 (or target-substrate contact pads 12) with electrodes 28. As shown in FIG. 1B, cured adhesive 36 can be field etched (e.g., with an oxygen plasma) to remove exposed cured adhesive 36, a dielectric structure 29 can be patterned over the edges of non-post component 20, and electrode 28 can be patterned over target substrate 10 and patterned dielectric structure 29 to electrically connect component contact pad 26 to wire 14. Patterned dielectric structure 29 can electrically insulate non-post component 20 (e.g., a bare, unpackaged integrated circuit having a semiconductor substrate) from electrode 28. Wires 14, target-substrate contact pads 12, and electrodes 28 can all be made using photolithographic methods and materials, for example from electrically conductive metal. Non-post component 20 and post component 22 together with component circuit 23 and component contact pads 26 can be constructed using photolithographic methods and materials on a component source wafer. Component tether 21 can be constructed on the component source wafer and broken (e.g., fractured) or separated when non-post components 20 and post components 22 are transfer printed, for example using micro-transfer printing techniques.

Post components 22 with connection posts 24 (e.g., sharp electrically conductive spikes extending from a body of post component 22 and electrically connected with conductors or wires 14 to component circuit 23 in post component 22) can be micro-transfer printed over target substrate 10 in physical alignment with target-substrate contact pads 12 so that component connection posts 24 come into contact with target-substrate contact pads 12 to electrically connect component circuit 23 to target-substrate contact pads 12. Target-substrate contact pads 12 can be electrically connected to any other target-substrate devices on target substrate 10, e.g., through patterned metal wires 14 formed on or in target substrate 10. Post components 20 with connection posts 24 and non-post components 20 without connection posts 24 are generically referred to as components 20.

Electrical contact between connection posts 24 and target-substrate contact pads 12 can be made by the micro-transfer printing process, in some embodiments in combination with a subsequent curing step, reducing manufacturing steps and costs. Post components 22 with connection posts 24 reduce the area over target substrate 10 needed to electrically connect post components 22 to other electrical devices or integrated circuits on target substrate 10 because the target-substrate contact pads 12 are beneath post components 22 rather than laterally or horizontally adjacent to post components 22 (e.g., in a lateral or horizontal direction L substantially parallel to a surface of target substrate 10). This reduction in area can be especially useful if it is advantageous to closely space post components 22 over target substrate 10, for example if post components 22 are light-emitting diodes in a pixel emitting different colors of light that are intended to be perceived as a single light emitter by a human observer. At the same time, component circuits 23 in some non-post components 20 can have many more component contact pads 26 that are not suitably connected using connection posts 24 (e.g., because components 20 or target substrate 10 are insufficiently flat and connection posts 24 extend over too large an area of components 20 or target substrate, which can together cause detrimental curvature-based effects) and can be electrically connected using electrodes 28, e.g., thin-film interconnects 28 made using redistribution layer (RDL) methods and materials. Because post components 22 and non-post components 20 can be very thin, bare, unpackaged micro-transfer printed integrated circuits (e.g., having a thickness not greater than twenty microns, no greater than ten microns, no greater than five microns, no greater than two microns, or no greater than one micron), electrodes 28 can have a small step height and are readily and reliably formed using photolithographic or RDL methods and materials.

A layer of uncured adhesive 30 (an uncured adhesive layer 30) disposed on target substrate 10 can facilitate adhering component 20 to target substrate 10. However, uncured adhesive layer 30 can also prevent or inhibit adequate physical and/or electrical connection between component connection posts 24 and target-substrate contact pads 12 during micro-transfer printing post components 22. The layer of uncured adhesive 30 can be heated to a relatively low reflow temperature (greater than room temperature, e.g., 120-180 degrees C.) to reflow uncured adhesive 30 and reduce the uncured adhesive 30 viscosity. Uncured adhesive 30 then reflows and wicks along the surfaces and sides of post component 22, physically pulling post component 22 closer to target substrate 10 and component connection posts 24 closer to (e.g., into contact with) target-substrate contact pads 12. For example, reflowed, uncured adhesive 30 can underfill any gap between uncured adhesive 30 and post component 22. A reflow process liquefies an adhesive material (e.g., uncured adhesive 30) and provides a reflowed adhesive 34 so that surface energies and surface tension can move (e.g., wick) the adhesive material along a surface, such as a surface of target substrate 10, bottom and side surfaces of post component 22, and connection posts 24. The reflowed uncured adhesive 34 movement can be over a lateral distance no less than two, five, ten, twenty, fifty, one hundred, or two hundred microns. Reflowed uncured adhesive 34 can then be hard cured at a relatively higher temperature compared to the reflow temperature to further shrink the adhesive and form a hard-cured adhesive 36, pulling post component 22 and connection posts 24 (further) into physical and electrical contact with target-substrate contact pads 12, and permanently fix the structure into place. In embodiments of the present disclosure, uncured adhesive 30 or reflowed adhesive 34 is an adhesive that is not hard-cured (e.g., uncured adhesive 30 can be soft cured or reflowed).

According to embodiments of the present disclosure, micro-transfer-printed electrical systems formed on target substrates 10 comprise both components 20 with connection posts 24 (post components 22) and components 20 without connection posts 24 (non-post components 20). (Such components can be referred to as first components 22, 20 and second components 22, 20.) Component circuits 23 in post components 22 with connection posts 24 can be electrically connected through connection posts 24 to target-substrate contact pads 12 on target substrate 10. Component circuits 23 in non-post components 20 (e.g., components 20 with desirably many electrical connections not easily provided with many connection posts 24) can be electrically connected to component contact pads 26 on a top side of non-post component 20 opposite target substrate 10 using thin-film interconnections 28 (e.g., electrodes 28) made using redistribution layer (RDL) methods to electrically connect thin-film interconnections 28 and wires 14 adjacent to non-post component 20 on target substrate 10. Thus, in some embodiments, it is preferable or required that both post components 22 and non-post components 20 are aligned to electrical structures (e.g., target-substrate contact pads 12 and wires 14) on target substrate 10.

Surprisingly and unexpectedly, it has been discovered that the reflow process used to move post components 22 closer to target substrate 10 and target-substrate contact pads 12 can inhibit the successful transfer and electrical connection to non-post components 20 by laterally moving non-post components 20 horizontally and substantially parallel to target-substrate surface 11 so that non-post components 20 are mis-registered with respect to any wires 14 or target-substrate contact pads 12 on target substrate 10.

Experiments have shown that in some circumstances, especially if components 20 are placed close together (e.g., within two hundred, one hundred, fifty, twenty, ten, five, or two microns laterally or horizontally in a lateral direction L over target substrate 10), the adhesive reflow process can move so much adhesive close to or in contact with surfaces of post component 22 and connection posts 24 that other areas of target substrate 10 lack sufficient uncured adhesive 30 to reliably adhere a transfer printed non-post component 20 to target substrate 10 after the reflow process is complete, for example areas within two, five, ten, twenty, fifty, one hundred, or two hundred microns and especially areas within fifty microns, thirty, twenty, ten, or five microns of post component 22. An additional coating of uncured adhesive 30, for example provided by spin coating, is expensive and problematic given the presence of post component 22.

If non-post component 20 is transfer printed onto uncured adhesive layer 30 on target substrate 10 before the reflow process, the movement of reflowed uncured adhesive 34 to post component 22 during the reflow process can physically move non-post component 20 out of alignment, mis-registering non-post component 20 and inhibiting a subsequent electrical connection from wire 14 on target substrate 10 to a component contact pad 26 on non-post component 20 using a thin-film interconnection process. In other words, electrode 28 will be misplaced with respect to component contact pad 26 and therefore fail to make an electrical connection to component contact pad 26 (as discussed further with respect to FIG. 18B below).

Surprisingly and unexpectedly, it has been discovered through experimentation that exposing uncured adhesive layer 30 to electromagnetic radiation 40 (e.g., exposing uncured adhesive layer 30 to ultra-violet light) can sufficiently inhibit the reflow of uncured adhesive 30 when uncured adhesive 30 is heated. However, a flood exposure (e.g., exposing the entire layer of uncured adhesive 30) inhibits the desirable adhesive reflow for post component 22 to bring post component 22 connection posts 24 closer or into physical and electrical contact with target-substrate contact pads 12, which can prevent adequate electrical contact between component connection posts 24 and target-substrate contact pads 12, although the flood exposure does desirably inhibit or prevent movement (e.g., lateral movement L substantially horizontally parallel to a surface of target substrate 10 coated with uncured adhesive 30) of non-post component 20 due to reflowed uncured adhesive 34 movement.

According to embodiments of the present disclosure, adhesive reflow for post components 22 is accomplished and movement of non-post component 20 at the same time is inhibited or prevented by (i) pattern-wise preventing exposure to the electromagnetic radiation 40 in a first area adjacent to post component 22, for example around a perimeter of post component 22 or uncured adhesive 30 in contact with post component 22 and (ii) pattern-wise exposing uncured adhesive 30 to electromagnetic radiation 40 in a second area adjacent to non-post component 20, for example around a perimeter of non-post component 20 or uncured adhesive 30 in contact with non-post component 20, e.g., by exposure through a photolithographic mask. This patterned adhesive exposure immediately (e.g., spatially closely or nearby) around non-post component 20 only (e.g., not immediately around post component 22 or not spatially closely or nearby) can (i) inhibit or prevent substantial horizontal or lateral non-post component 20 movement (e.g., in lateral direction L) thereby enabling electrical connection to component contact pads 26 using thin-film interconnections 28 and RDL methods and (ii) enable adhesive reflow in an area adjacent to post component 22 (enabling electrical connection between component connection posts 24 and target-substrate contact pads 12 by enabling post component 22 movement toward component contact pads 26).

Figures 6A, 6B:
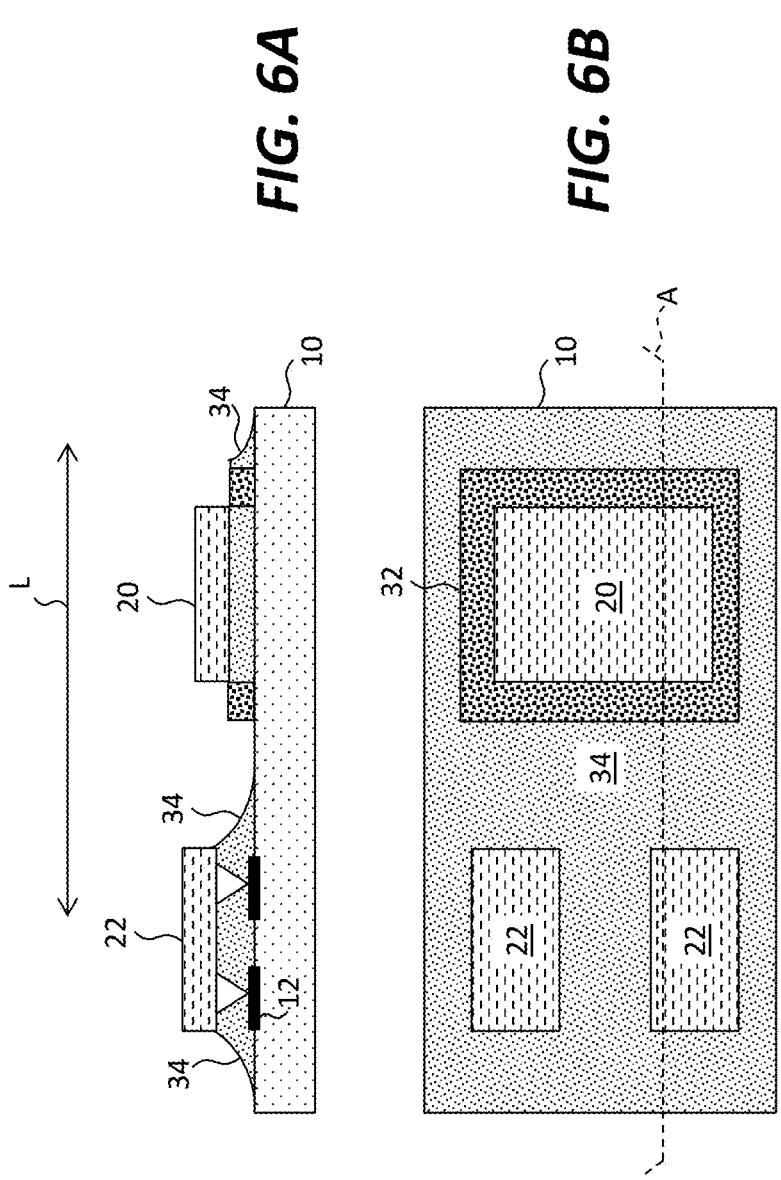
Figures 7A, 7B:
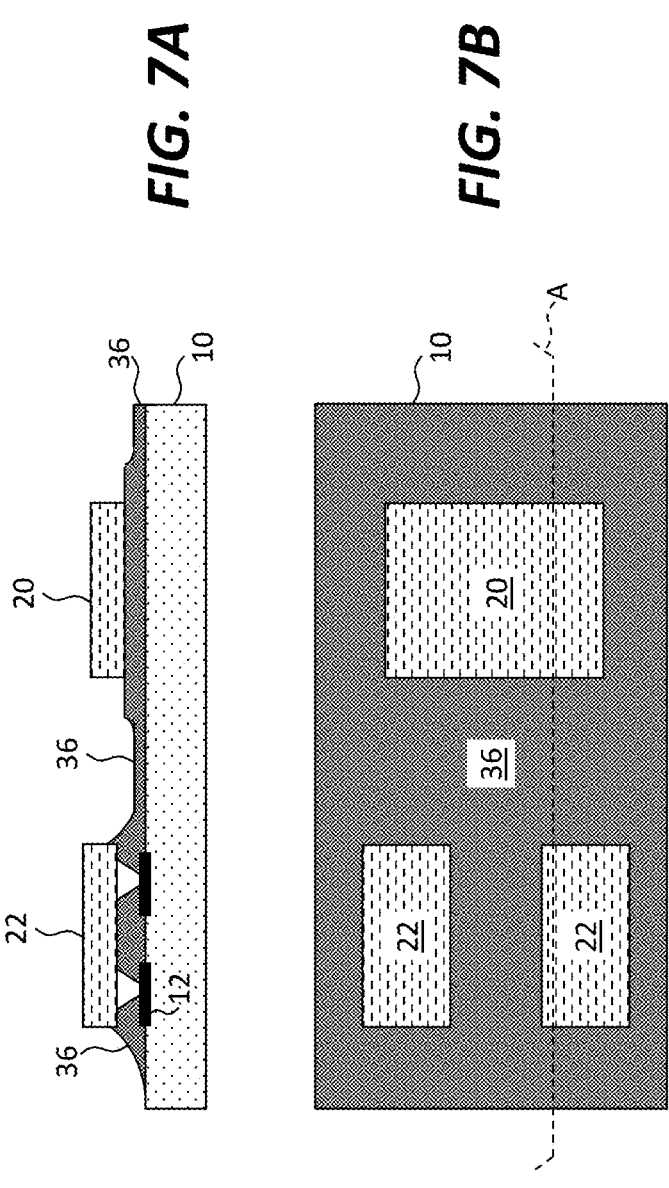
Figure 8:
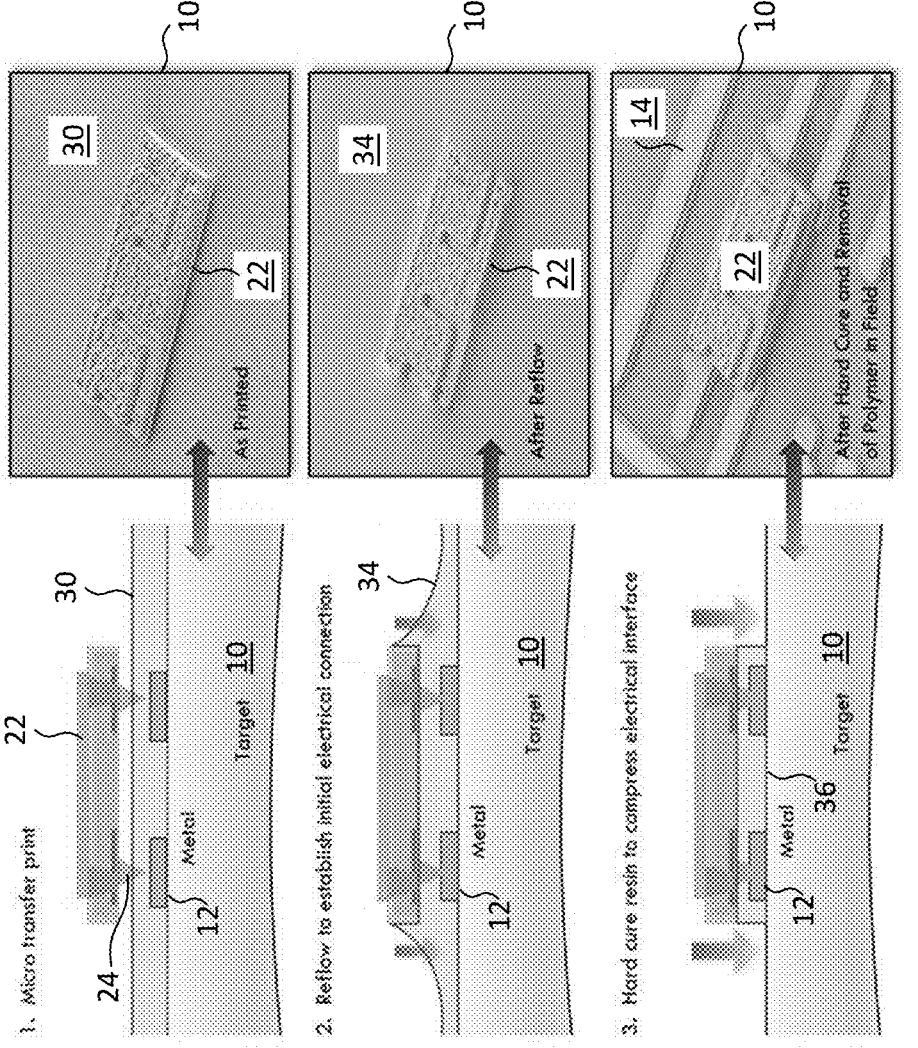
FIG. 8 shows successive cross sections and corresponding micrographs of structures, according to illustrative embodiments of the present disclosure.
Figure 9:
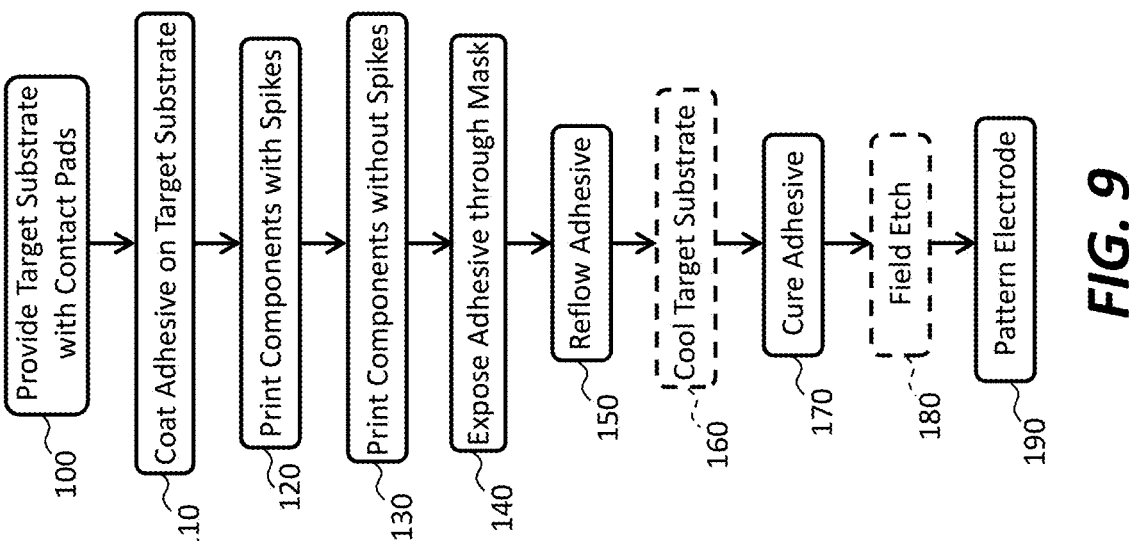

FIGS. 2A and 2B, 3A and 3B, 4A and 4B, 5A and 5B, 6A and 6B, and 7A and 7B are cross sections A taken across cross section line A of corresponding plan views B illustrating successive structures according to illustrative embodiments of the present disclosure. FIG. 8 shows an illustrative cross section and corresponding micrograph of reflow and field etch steps according to embodiments of the present disclosure. FIGS. 9 and 10 are flow diagrams illustrating steps in methods of the present disclosure.

Figure 2A:
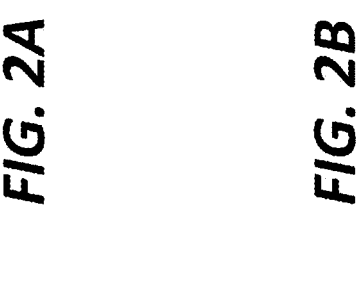
Figure 2B:
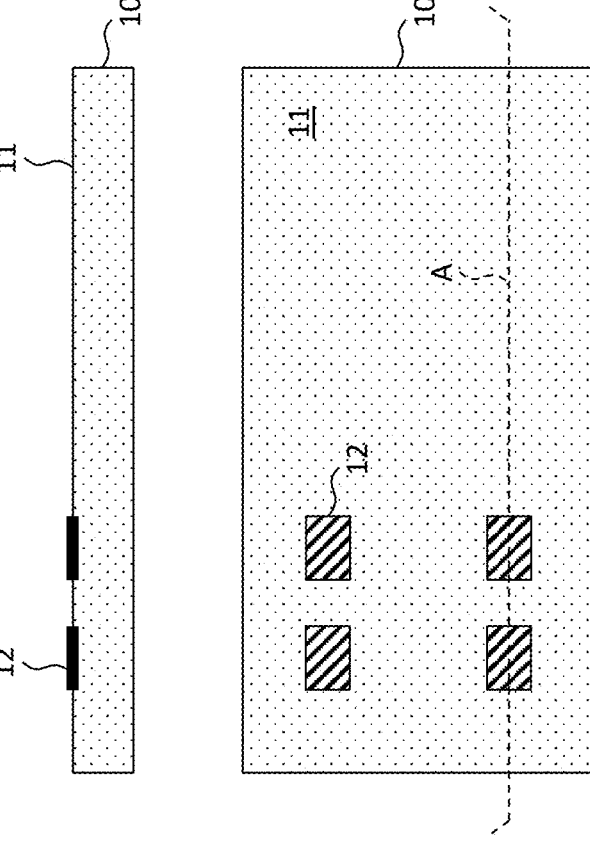
Figures 3A, 3B:
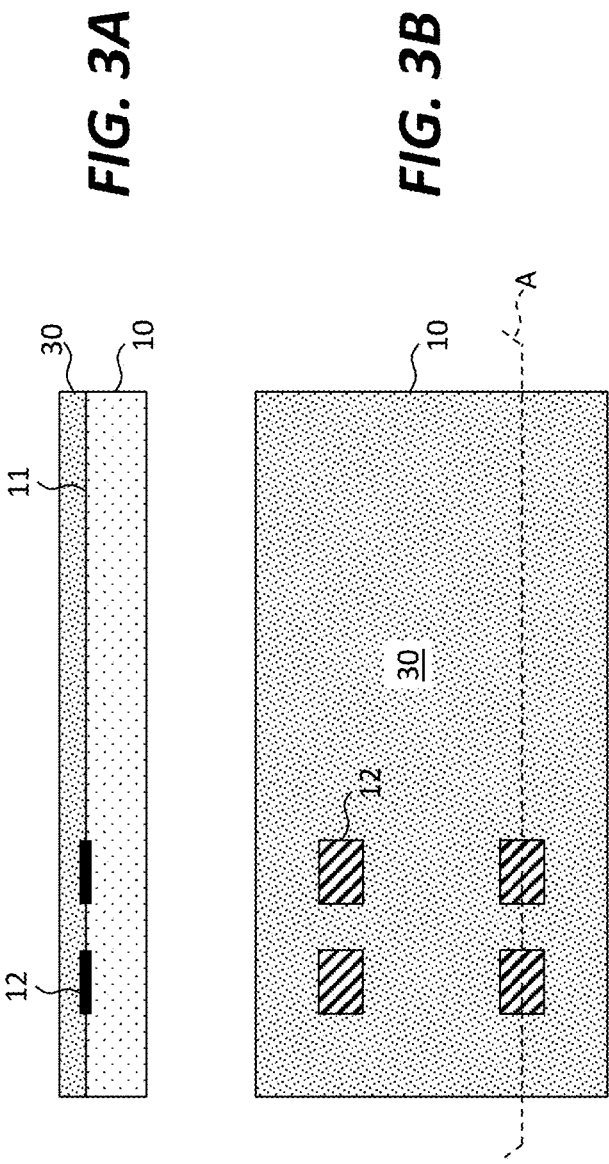
Figures 4A, 4B:
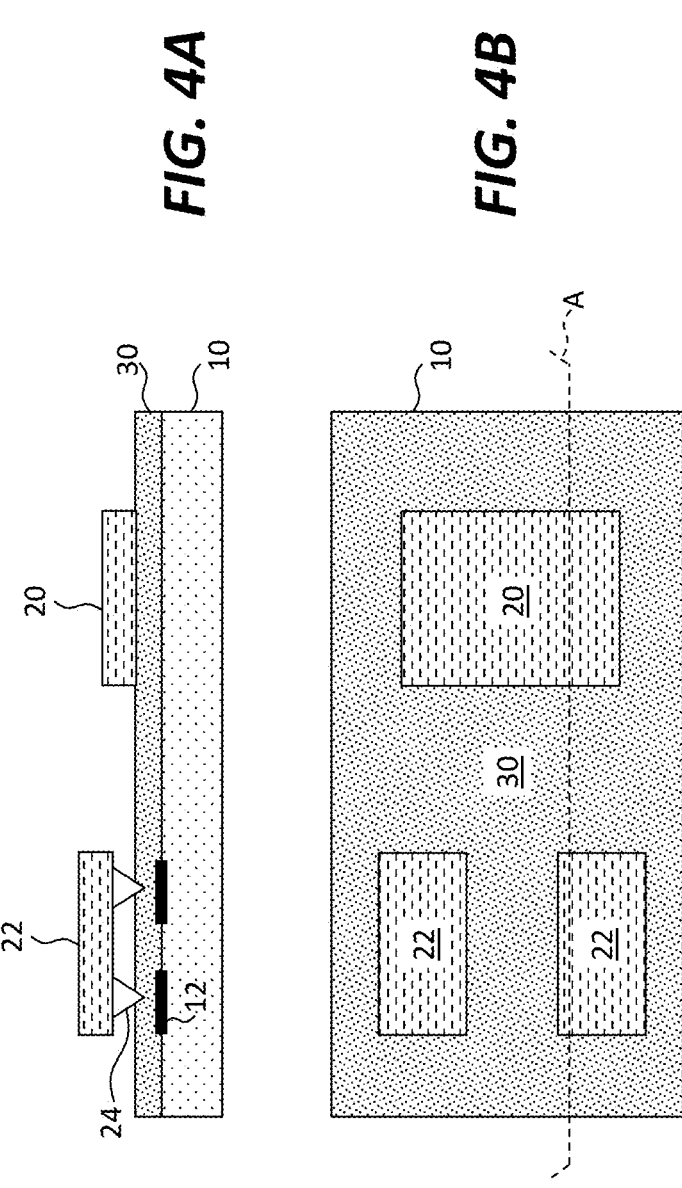

According to illustrative embodiments of the present disclosure, a method of making a printed structure comprises providing a target substrate 10 (e.g., a destination substrate or substrate) having a target-substrate contact pad 12 disposed on a surface of target substrate 10 in step 100 and as shown in FIGS. 2A and 2B. In step 110 and as shown in FIGS. 3A and 3B, target substrate 10, including target-substrate contact pads 12, can be coated (e.g., by spin, curtain, or spray coating) with an uncured adhesive 30. In steps 120 and 130 and as shown in FIGS. 4A and 4B and the top illustration and micro-graph of FIG. 8, a post component 22 and a non-post component 20 are disposed (e.g., by micro-transfer printing) onto (e.g., in direct contact with) uncured adhesive 30 over target substrate 10. Post component 22 has an electrical connection (e.g., connection post 24) disposed on a bottom side of post component 22 adjacent target substrate 10 and extending from post component 22 toward target-substrate contact pad 12 over or on and in alignment with target-substrate contact pad 12. Non-post component 20 can comprise a component contact pad 26, for example disposed on a top side of non-post component 20 opposite target substrate 10. Post component 22 and non-post component 20 can be laterally relatively displaced over target substrate 10 (e.g., spatially separated in a lateral or horizontal direction L substantially parallel to a surface of target substrate 10). Post component 22 and non-post component 20 can be disposed by micro-transfer printing in a common step (steps 120 and 130 are a common step) or in separate steps 120 and 130 in any order and are generically described in FIG. 10. Both or either of post component 22 and non-post component 20 can comprise a broken (e.g., fractured) or separated component tether 21 as a consequence of micro-transfer printing from respective component source wafers.

Figures 5A, 5B:
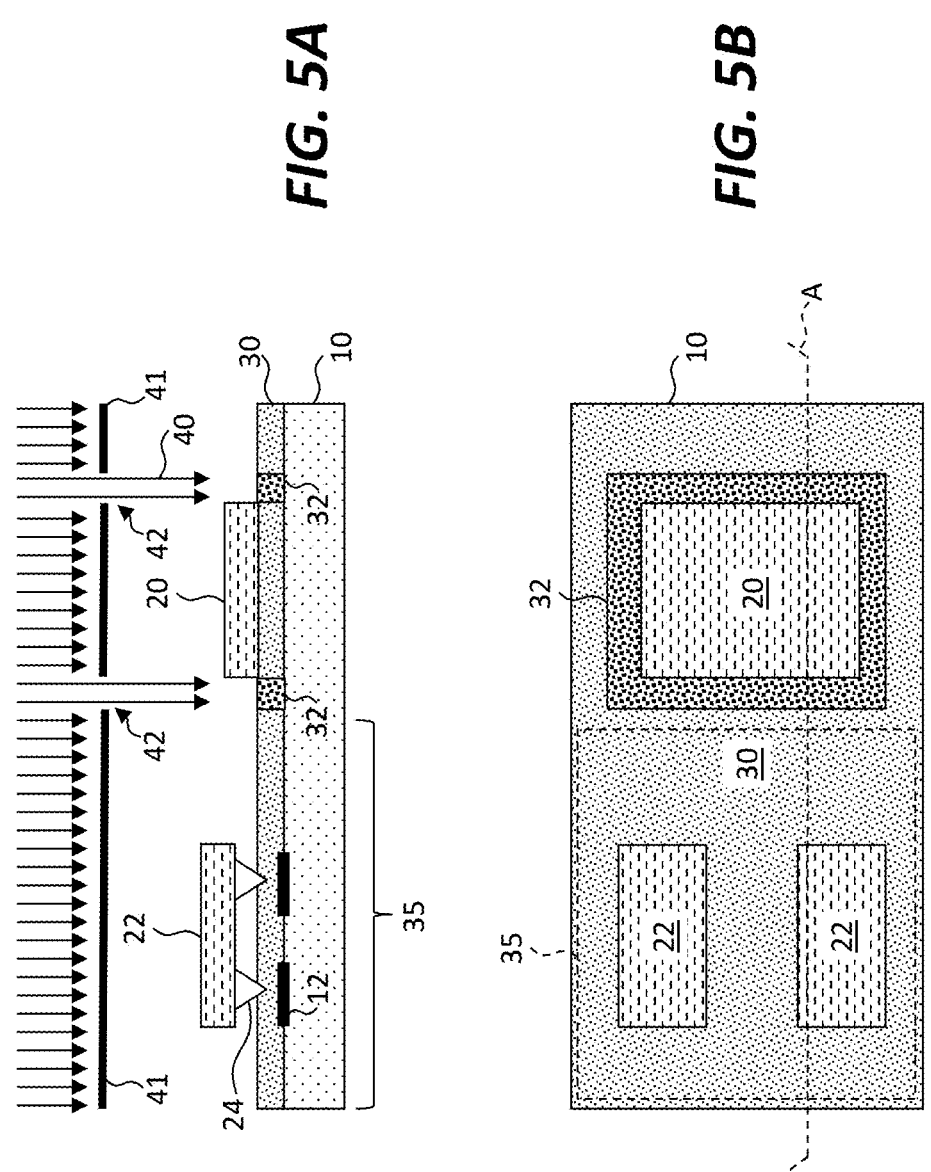

In step 140 and as shown in FIGS. 5A and 5B, uncured adhesive 30 is pattern-wise processed so that a first portion 35 of uncured adhesive 30 adjacent to post component 22 is not processed and a second portion 32 of uncured adhesive 30 adjacent to non-post component 20 is processed to provide process adhesive 32. Processed adhesive 32 is an uncured adhesive 32 that has been processed but is not a hard-cured adhesive 36. The pattern-wise processing (e.g., adhesive processing) is not a hard-cure process but, rather, inhibits or reduces reflow of processed uncured adhesive 30 (e.g., processed adhesive 32) at reflow temperatures. Second portion 32 of processed uncured adhesive 32 is indicated in FIGS. 5A and 5B with darker shading than first portion 35 of uncured adhesive 30 partially indicated in the dashed rectangle. (Effectively, any uncured adhesive 30 that is not processed comprises first portion 35 of uncured adhesive 30 whether or not shown in the dashed rectangle.) The processing can (i) comprise exposure to electromagnetic radiation 40 (e.g., ultraviolet radiation 40) through a mask 41 with mask openings 42 as shown in FIG. 5A, (ii) pattern-wise release a catalyst in uncured adhesive 30, for example as a consequence of (i), (iii) pattern-wise cross link uncured adhesive 30, for example as a consequence of (i) and (ii) with or without heating uncured adhesive 30, (iv) pattern-wise diminishing the capacity of second portion 32 of uncured adhesive 30 to reflow, or (v) any one or combination of (i), (ii), (iii), and (iv). Pattern-wise curing uncured adhesive 30 can act to at least partially soft-cure adhesive 30 (e.g., by crosslinking a portion of adhesive 30). Soft cured portion(s) of adhesive 30 can later be hard cured with a blanket (field) exposure, for example along with any unprocessed portion(s) of adhesive 30. Thus, in embodiments processed second portion 32 of uncured adhesive 30 has a reduced capacity to reflow compared to first portion 35 of uncured adhesive 30.

Second portion 32 of uncured adhesive 30 (e.g., processed adhesive 32) can at least partially laterally surround (e.g., in a horizontal or lateral direction L) non-post component 20, can form at least a portion of a perimeter around non-post component 20, or can interpose (e.g., form a wall or barrier) between post and non-post components 22, 20 (e.g., can both form at least a portion of a perimeter and be interposed). Second portion 32 of processed adhesive 32 need not completely surround or interpose between post component 22 and non-post component 20 in order for processed second adhesive portion 32 to inhibit the spatial and lateral movement of uncured adhesive 30 under, directly around, or relatively near non-post component 20 during reflow in step 150, for example so that non-post component 20 does not substantially move with respect to wires 14 or target-substrate contact pads 12 on target substrate 10 so that component contact pads 26 can electrically connect to wires 14 with electrodes 28 by means of a subsequent photolithographic or RDL process. In some embodiments, processing adhesive between first component 20, 22 and second component 22, 20 such that processed adhesive 32 is only interposed therebetween is sufficient to appropriately and/or desirably inhibit component movement.

First portion 35 of uncured adhesive 30 is then reflowed, e.g., by heating to a reflow temperature, to provide reflowed adhesive 34 in step 150 and as shown in FIGS. 6A and 6B and the center illustration and micrograph of FIG. 8. Heating can comprise heating target substrate 10, components 20, and uncured adhesive 30 for example keeping target substrate 10, components 20, and uncured adhesive 30 at a reflow temperature, for example a constant reflow temperature less than a cure temperature, for example for a period no less than fifteen seconds, thirty seconds, one minute, two minutes, three minutes, four minutes, ten minutes, fifteen minutes, or thirty minutes. According to embodiments of the present disclosure, reflowing unprocessed first portion 35 of uncured adhesive 30 moves post component 22 closer to target substrate 10 and connection posts 24 closer to target-substrate contact pads 12, e.g., into contact with target-substrate contact pads 12, for example in response to surface energy differentials or mechanical (physical movement) forces due to wicking or surface tension. Because second portion 32 of adhesive is processed it does not substantially reflow (e.g., at least not enough to move non-post component 20 substantially and laterally over target substrate surface 11).

The printed structure (e.g., components 20 assembled on and adhered to target substrate 10) is optionally cooled in step 160. In step 170 and as shown in FIGS. 7A and 7B, uncured adhesive 30 (both the unprocessed and reflowed adhesive 34 first portion 35 and the processed second portion 32) is hard cured to form hard-cured adhesive 36, e.g., by heating uncured adhesive 30 to a hard-cure temperature. Hard curing uncured adhesive 30 can move post component 22 closer to target substrate 10 so that the electrical connection (e.g., connection post 24) is more firmly in electrical contact with target-substrate contact pad 12 and moves non-post component 20 closer to target substrate 10.

Optionally, exposed hard-cured adhesive 36 is field etched (e.g., by oxygen plasma etching) in step 180 so that exposed hard-cured adhesive 36 that is not between post component 22 and target substrate 10 and is not between non-post component 20 and target substrate 10 is removed, as shown in the bottom illustration and micro-graph of FIG. 8. Patterned dielectric structure 29 can be disposed on non-post component 20 to insulate non-post component 20 from electrode 28 patterned over target substrate 10 and component 20. Electrode 28 can be patterned in step 190 to electrically connect component contact pad 26 of non-post component 20 to wires 14 or target-substrate contact pads 12 on target substrate 10.

Figure 11B:
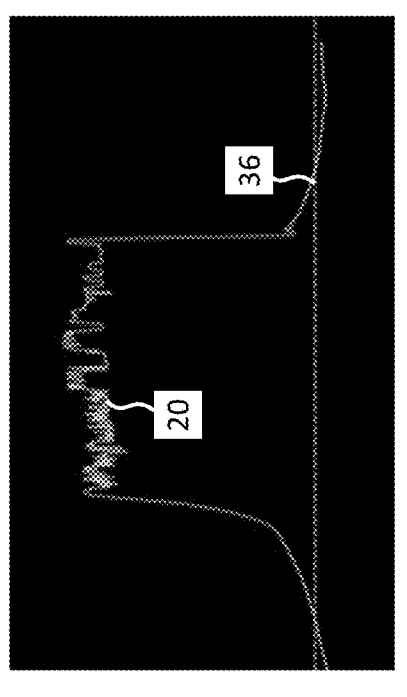
FIG. 11A is a micrograph of a structure comprising a component disposed on a target substrate and FIG. 11B is a profilometer measurement across the structure of FIG. 11A according to illustrative embodiments of the present disclosure.
Figure 11A:
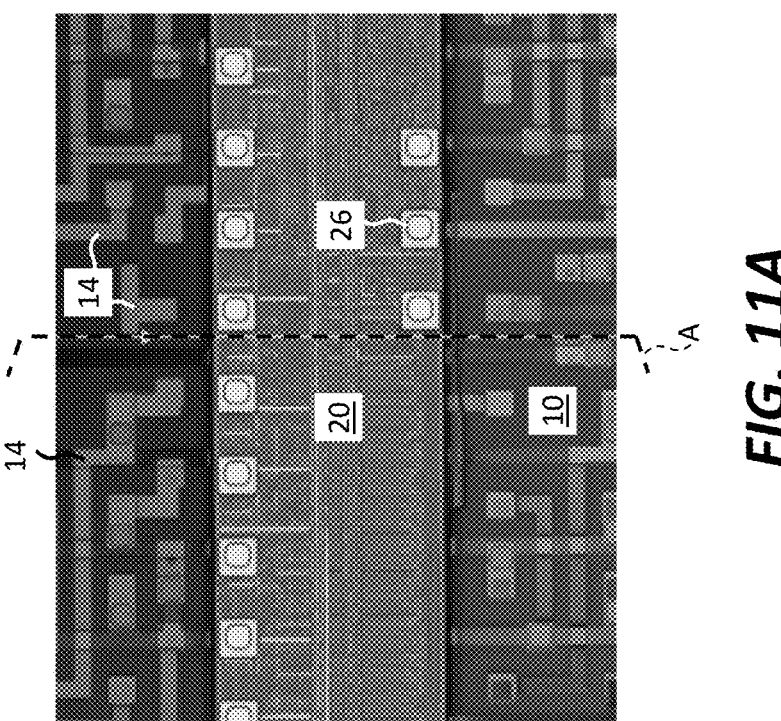
Figure 12B:
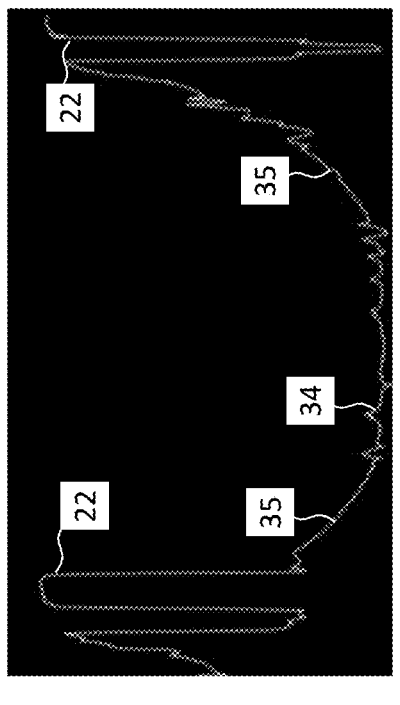
FIG. 12A is a micrograph of a structure comprising components disposed on a reflowed adhesive layer on a target substrate and FIG. 12B is a profilometer measurement across the structure of FIG. 12A according to illustrative embodiments of the present disclosure.
Figure 12A:
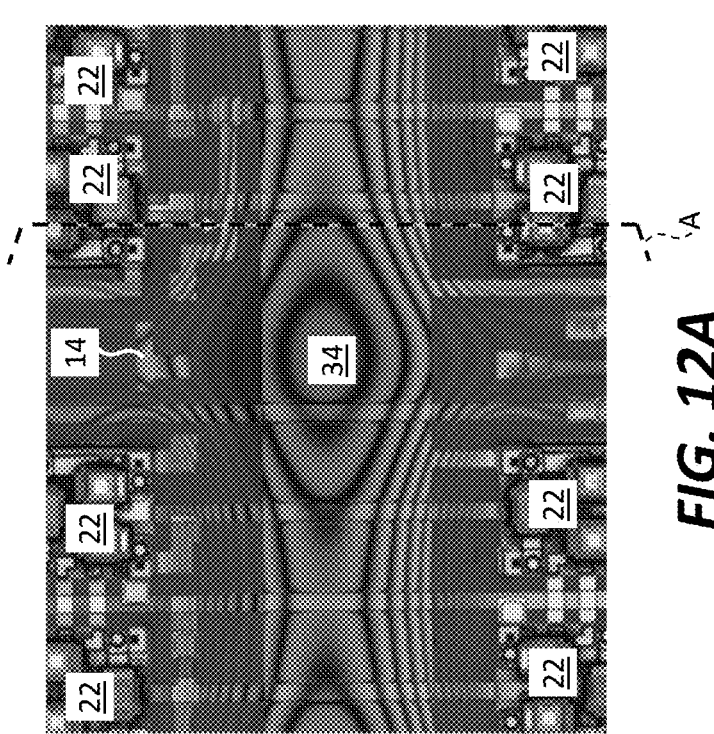
Figure 13B:
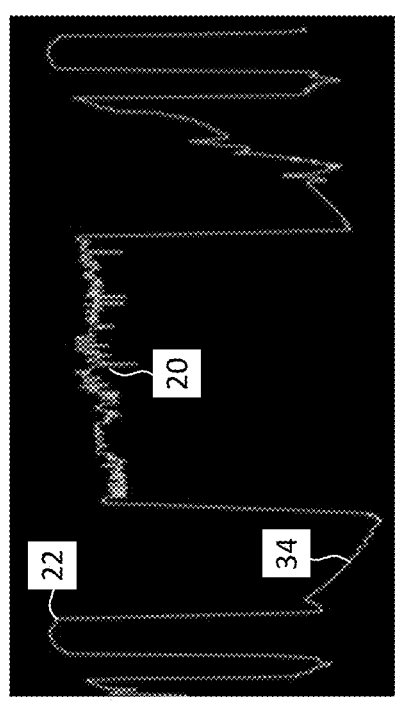
FIG. 13A is a micrograph of a structure comprising components disposed on a reflowed and pattern-wise processed adhesive layer on a target substrate and FIG. 13B is a profilometer measurement across the structure of FIG. 13A according to illustrative embodiments of the present disclosure.
Figure 13B:

The FIG. 11A micrograph shows a non-post component 20 with component contact pads 26 adhered using an adhesive (e.g., a hard-cured adhesive 36) to a target substrate 10 with wires 14. The FIG. 11B profilometer trace shows the relative height of component 20 over target substrate 10. (The relative height of a structure shown by the profilometer traces in FIGS. 11B, 12B, and 13B is marked with a label corresponding to the structure.) The FIG. 12A micrograph shows post components 22 adhered using an adhesive (e.g., a hard-cured adhesive 36) to a target substrate 10 with wires 14. The optical fringes near post component 22 are close together, showing a rapid and large change in height of reflowed adhesive 34 (e.g., first portion 35) and the more spaced-apart optical fringes show that the areas between post and non-post components 22, 20 have relatively small changes in height. The FIG. 12B profilometer trace shows the absence or near-absence of uncured adhesive 30 in between post components 22 after reflow and when none of uncured adhesive 30 is processed.

Figure 13A:
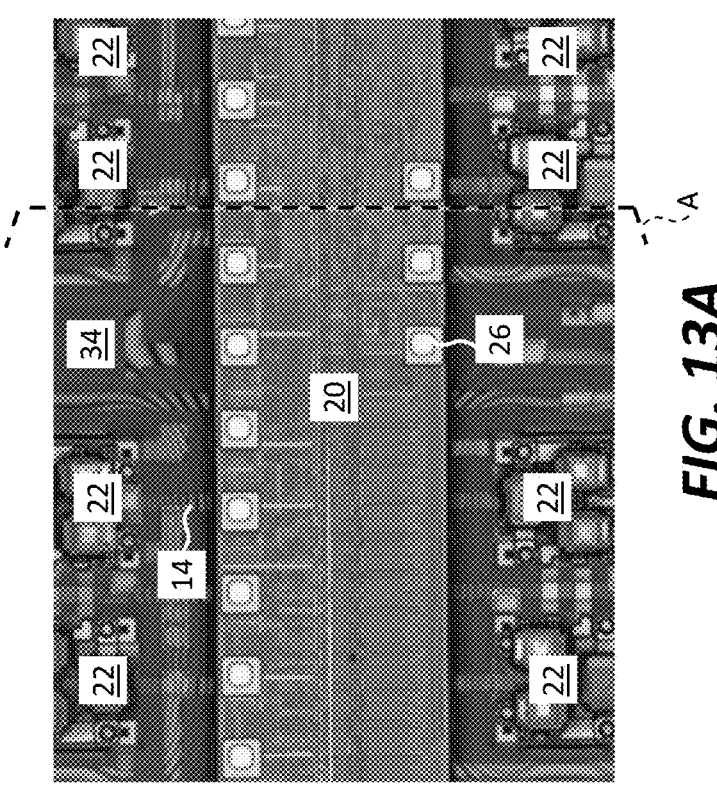

FIGS. 13A and 13B show the effective result of embodiments of the present disclosure. Post components 22 are adhered with a reflowed adhesive 34 that, shown by the many optical fringes close to post component 22, show a rapid and large change in height of reflowed adhesive 34 (e.g., first portion 35). Non-post component 20 with component contact pads 26 disposed on target substrate 10 and surrounded by processed uncured adhesive 30 is well aligned with wires 14 on target substrate 10. The FIG. 13B profilometer trace shows post component 22, non-post component 20, and reflowed adhesive 34 growing much thicker adjacent to and in contact with post component 22 (e.g., first portion 35).

Thus, in some embodiments of the present disclosure, first portion 35 of uncured adhesive 30 is reflowed on a side of or spatially adjacent to post component 22 to a first height because reflowed adhesive 34 is free to move and second portion 32 of uncured adhesive 30 is present on a side of or adjacent to non-post component 20 to a second height that is less than the first height because processed uncured adhesive 32 is not free to move. First portion 35 of uncured adhesive 30 between post component 22 and target substrate 10 or adjacent to post component 22 is thicker than a second portion 32 of uncured adhesive 30 between non-post component 20 and target substrate 10 or adjacent to non-post component 20. Uncured adhesive 30 can have a thickness over target substrate 10 that is no greater than three microns (e.g., no greater than 2.5 microns, no greater than two microns, no greater than one micron, five hundred nm, two hundred fifty nm, one hundred nm, sixty nm, fifty nm, thirty nm, twenty nm, ten nm, or five nm).

Figure 14:
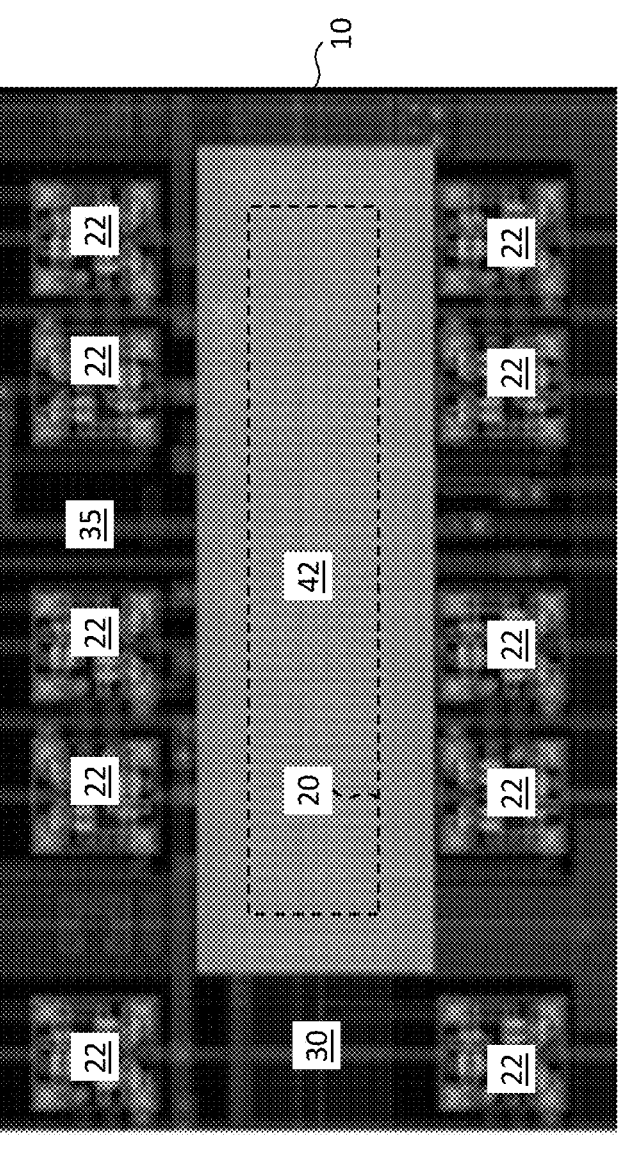
FIG. 14 is a micrograph with an inverse mask overlay on a structure comprising components disposed on a target substrate, according to illustrative methods of the present disclosure.

FIG. 14 is a micrograph with a superposed mask opening 42 showing patterning mask opening 42 in position with respect to non-post component 20 (obscured by and beneath superposed mask opening 42 but shown with dashed rectangle) and post components 22. (For clarity the inverse of patterning mask 41, that is mask opening 42 for exposed second portion 32, is indicated in FIG. 14, rather than mask 41 itself as shown in FIG. 5A. Post components 22 and their surrounding first area (first portions 35) are actually obscured by mask 41.) Other mask shapes are possible that prevent reflow in second areas (second portions 32) near non-post components 20 and enable reflow in first areas near post components 22. Both positive and negative exposure adhesives can be used according to embodiments of the present disclosure, so long as processing uncured adhesive 30 in second portion 32 inhibits reflow. Uncured adhesive 30 in first portion 35 can also be differently processed if the different processing does not substantially inhibit reflow.

Thus, in embodiments of the present disclosure, a printed structure comprises a target substrate 10 having a target-substrate contact pad 12 disposed on or in target substrate 10. Target-substrate contact pad 12 can be a patterned electrical conductor, for example comprising metal and patterned using photolithographic methods and materials. An uncured adhesive 30 can be disposed over target substrate 10 and target-substrate contact pad 12. A post component 22 can be disposed on uncured adhesive 30 over target-substrate contact pad 12. Post component 22 comprises or has an electrical connection (e.g., connection post 24) extending from a side of post component 22 adjacent to target substrate 10 toward target-substrate contact pad 12. A non-post component 20 can be disposed on uncured adhesive 30 and laterally displaced from post component 22 over target substrate 10. A first portion 35 of uncured adhesive 30 adjacent to post component 22 is not processed and a second portion 32 of uncured adhesive 30 adjacent to non-post component 20 is processed, so that the processed uncured adhesive 30 in second portion 32 reflows less than unprocessed uncured adhesive 30 in first portion 35.

Figure 15:
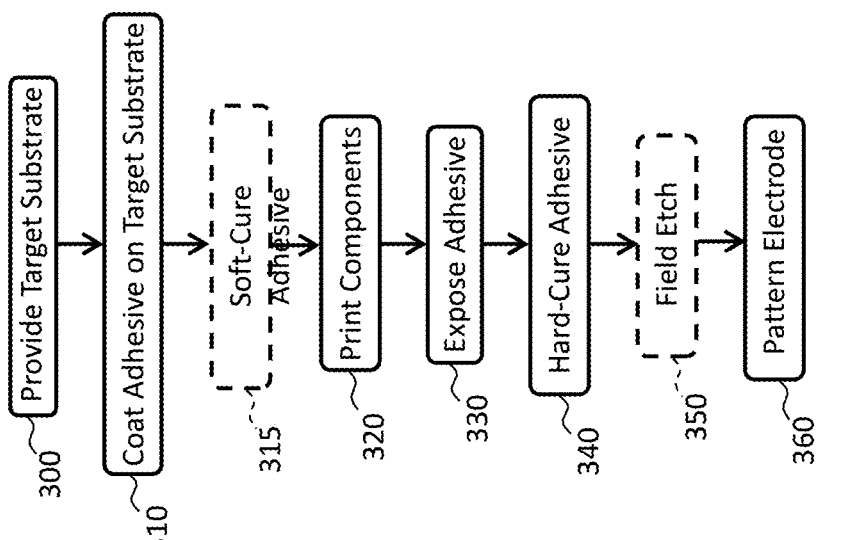
FIG. 15 is a flow diagram illustrating methods according to illustrative embodiments of the present disclosure.

In some embodiments, simply processing uncured adhesive 30 to prevent substantial non-post component 20 movement during reflow can enable electrode 28 connections to component contact pads 26. Thus, methods of the present disclosure as illustrated in the flow diagram of FIG. 15 can comprise providing a target substrate 10 in step 300, coating target substrate 10 with an uncured adhesive 30 in step 310, optionally soft-curing uncured adhesive 30 in step 315, disposing a component 20 on uncured adhesive 30 in step 320, processing uncured adhesive 30 in step 330 and as shown in FIGS. 16A and 16B to provide processed uncured adhesive 32, for example by exposing uncured adhesive 30 to electromagnetic radiation 40 such as ultraviolet radiation 40, and hard curing processed uncured adhesive 32 in step 340 and as shown in FIGS. 17A and 17B. Hard-cured adhesive 36 can be field etched in step 350 and an electrode 28 patterned in step 360 to electrically connect component 20 (e.g., component contact pad 26) to a wire 14 on target substrate 10 to make a printed structure as shown in FIG. 1B. Optional soft-cure step 315 can comprise heating uncured adhesive 30 to a temperature less than a temperature necessary to hard-cure the adhesive. A soft-cure step (e.g., step 315) can be at least partially the same as or similar to a reflow step in that the soft-cure step 315 can, in some embodiments, also reflow uncured adhesive 30 and can render uncured adhesive 30 patternable or planarized without hard curing uncured adhesive 30. As used herein, uncured adhesive 30 that is soft-cured remains an uncured adhesive 30 as opposed to a cured or hard-cured adhesive 36.

FIG. 18A shows illustrative embodiments of the present disclosure. Component 20 with component contact pad 26 is disposed on uncured adhesive 30 on target substrate 10 with target-substrate contact pad 12, at least a portion of uncured adhesive 30 surrounding component 20 is processed (e.g., by ultraviolet light exposure to release a catalyst in the exposed portion of uncured adhesive 30 such as second portion 32, upper illustration). Because processed adhesive 32 surrounds component 20, component 20 does not substantially move during reflow (or during a hard-cure step that increases a temperature from a room temperature through a reflow temperature to a hard-cure temperature) so that a thin-film electrical connection 28 (e.g., electrode 28) is properly aligned with respect to component 20 and component contact pad 26 is electrically connected to target-substrate contact pad 12 with electrode 28 (lower illustration). In contrast and as an illustrative demonstration shown in FIG. 18B of a problem recognized in this disclosure that can be encountered if uncured adhesive 30 is not processed, component 20 moves during reflow (even if only briefly exposed to a reflow temperature, such as during a hard-cure operation, upper illustration) so that component 20 and component contact pad 26 are misaligned with respect to electrode 28 (lower illustration), preventing or inhibiting a thin-film electrical connection 28 between component contact pad 26 and target-substrate contact pad 12 or wire 14 with electrode 28.

The processing can (i) comprise exposure to electromagnetic radiation 40 (e.g., ultraviolet radiation 40), either through a mask 41 as shown in FIG. 5A or without a mask 41 (e.g., a flood exposure as shown in FIGS. 16A, 16B), (ii) releasing a catalyst in uncured adhesive 30, for example as a consequence of (i), (iii) cross linking uncured adhesive 30, for example as a consequence of (i) and (ii) with or without heating uncured adhesive 30 (note that some cross linking can occur after radiation exposure and catalyst release even at room temperature), (iv) diminishing the capacity of second portion 32 of uncured adhesive 30 to reflow, or (v) any one or combination of (i), (ii), (iii), and (iv). Thus, in some embodiments, uncured adhesive 30 has a reduced capacity to reflow and component 20 is less likely to move (e.g., is substantially or effectively fixed in position) during a reflow or hard-cure process. In some embodiments, processing uncured adhesive 30 comprises processing only a portion of uncured adhesive 30 laterally adjacent to or in contact with component 20. For example, processed uncured adhesive 30 can at least partially laterally surround or at least partially form a perimeter around component 20.

In some embodiments of the present disclosure, a reflow operation (e.g., for post component 22) is not desired and it is simply desired to hard cure an adhesive used to adhere micro-transfer printed non-post components 20 to target substrate 10 in alignment at a desired position. However, the hard-cure operation can still cause non-post components 20 to move enough to mis-register components 20, especially non-post components 20, after micro-transfer printing. Hard curing uncured adhesive 30 can require heating uncured adhesive 30 to a temperature greater than a reflow temperature. However, uncured adhesive 30, if heated from room temperature to a hard-cure temperature must first be heated to a reflow temperature (even if only briefly and not held at such a reflow temperature). As uncured adhesive 30 is briefly and temporarily heated to a reflow temperature, uncured adhesive 30 can liquefy and flow, even if only for a few seconds (or less). During this brief moment, component 20 can move due to surface energy, uncured adhesive 30 surface tension, and wicking forces. According to embodiments of the present disclosure, by processing uncured adhesive 30 before hard curing uncured adhesive 30, uncured adhesive 30 is less susceptible to reflow so that component 20 movement is mitigated, reduced, or substantially prevented. By preventing component 20 movement, electrodes 28 patterned through fixed masks can electrically connect to component contact pads 26 without misregistration.

Figure 19:
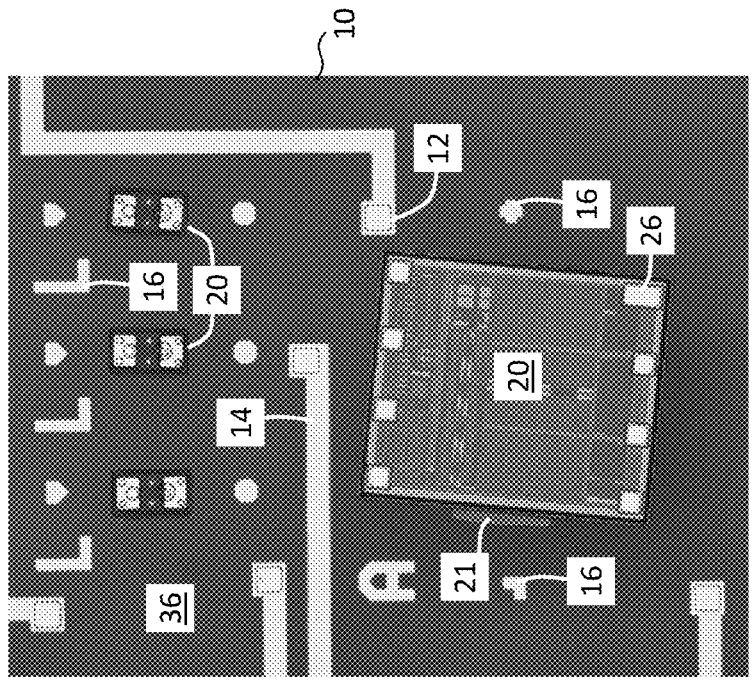
FIG. 19 is a micrograph of a micro-transfer-printed component on a target substrate after hard curing an unprocessed adhesive and before thin-film interconnection useful in understanding embodiments of the present disclosure.
Figure 20B:
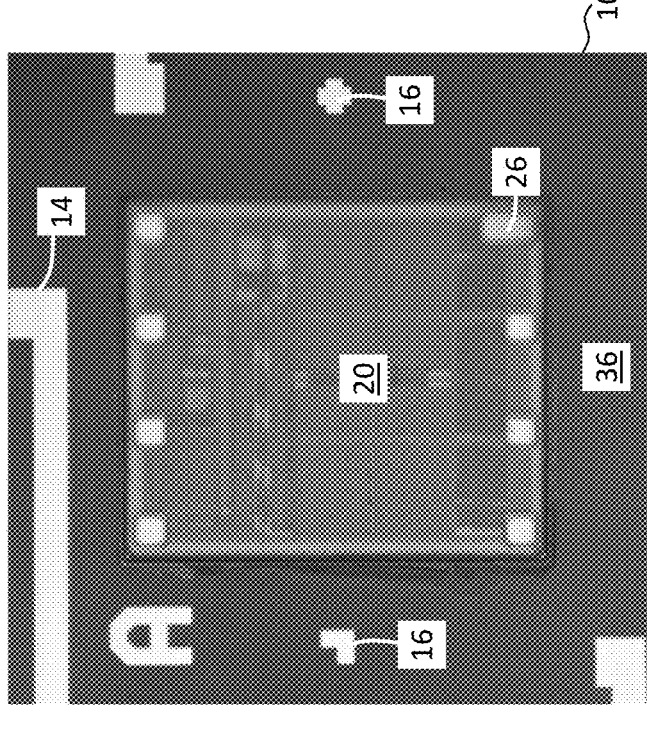
FIG. 20B is a micrograph of a micro-transfer-printed component on a target substrate after hard curing a processed adhesive and before thin-film interconnection corresponding to FIG. 20A according to illustrative embodiments of the present disclosure.
Figure 20A:
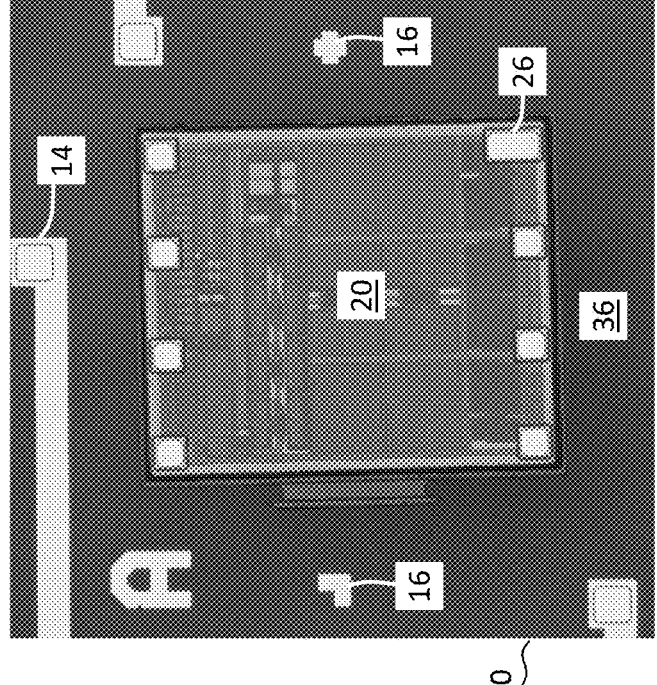
FIG. 20A is a micrograph of a micro-transfer-printed component on a target substrate after hard curing an unprocessed adhesive and before thin-film interconnection useful in understanding embodiments of the present disclosure.
Figures 21A, 21B:
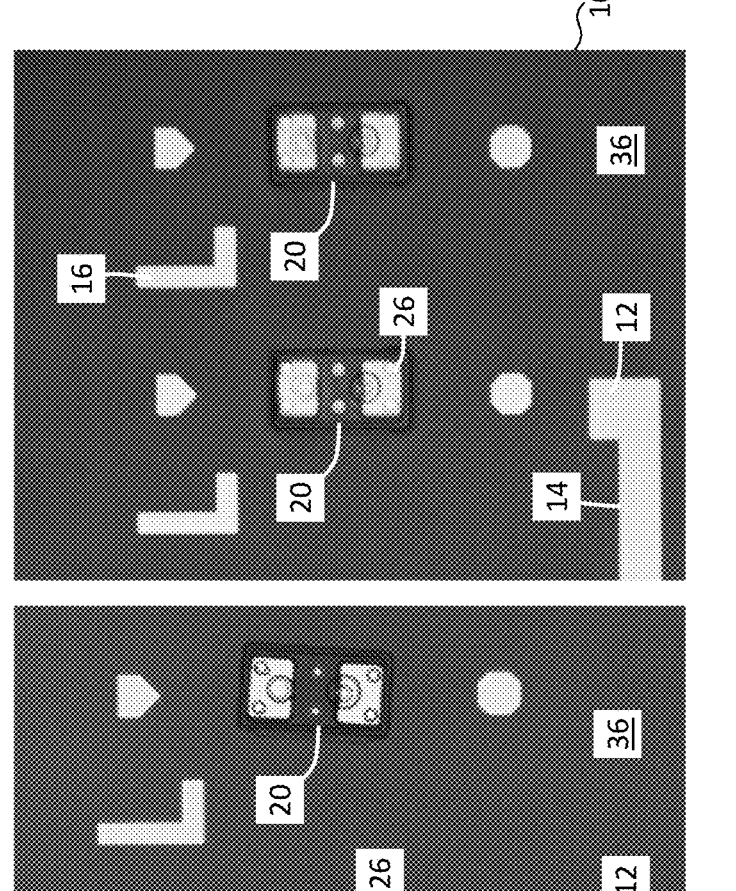
FIG. 21A is a micrograph of a micro-transfer-printed component on a target substrate after hard curing an unprocessed adhesive and before thin-film interconnection useful in understanding embodiments of the present disclosure.
FIG. 21B is a micrograph of a micro-transfer-printed component on a target substrate after hard curing a processed adhesive and before thin-film interconnection corresponding to FIG. 21A according to illustrative embodiments of the present disclosure.
Figure 22B:
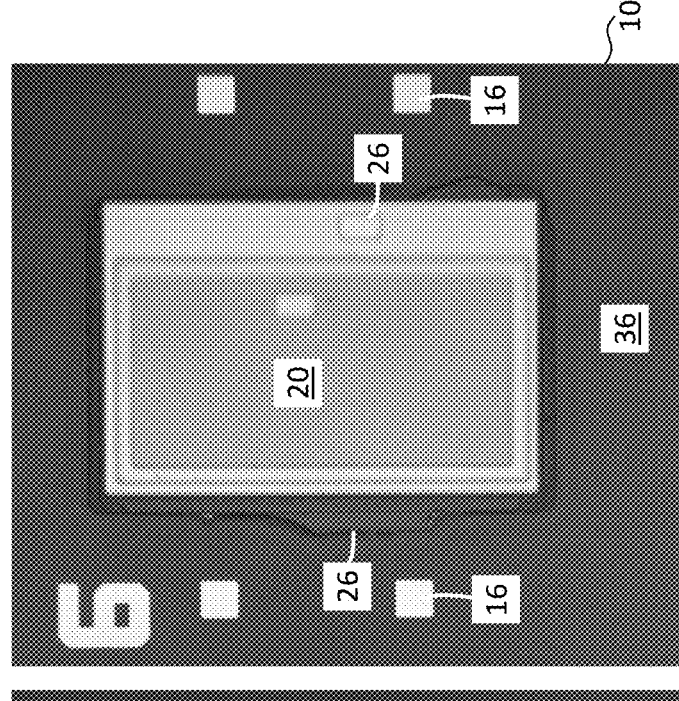
FIG. 22B is a micrograph of a micro-transfer-printed component on a target substrate after hard curing a processed adhesive and before thin-film interconnection corresponding to FIG. 22A according to illustrative embodiments of the present disclosure.
Figure 22A:
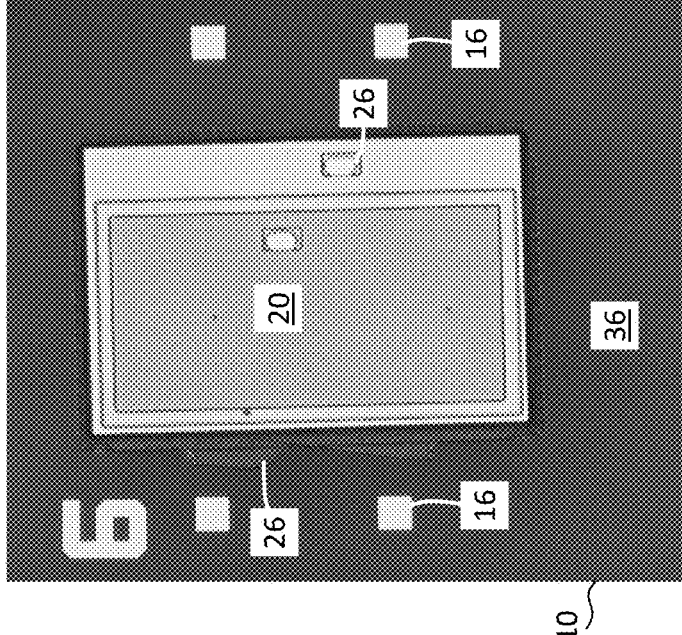
FIG. 22A is a micrograph of a micro-transfer-printed component on a target substrate after hard curing an unprocessed adhesive and before thin-film interconnection useful in understanding embodiments of the present disclosure.

FIG. 19 is a micrograph of a component with component contact pads 26 micro-transfer-printed onto an uncured adhesive layer (e.g., uncured adhesive 30) on target substrate 10 with spatial reference to alignment marks 16, wires 14, and target-substrate contact pads 12. The uncured adhesive 30 is not processed but is hard cured in step 340 by ramping uncured adhesive 30 from room temperature through a reflow temperature (e.g., 140 degrees C.) to a hard-cure temperature (e.g., 200 degrees C.). Because of the surface energies, surface tension, and wicking, the adhesive flows briefly at the reflow temperature, moving components 20, as shown with the misaligned larger integrated circuit component 20 and the smaller light-emitting diode component 20 at the upper right of FIG. 19, so that components 20 are misaligned with respect to alignment marks 16, wires 14, and target-substrate contact pads 12. FIGS. 20A, 21A, and 22A similarly demonstrate misaligned components 20 micro-transfer-printed onto an uncured adhesive layer 30 that is not processed and consequently move during the hard-cure process (because unprocessed adhesive 35 becomes less viscous during reflow). In contrast, FIGS. 20B, 21B, and 22B demonstrate corresponding components 20 micro-transfer-printed onto an uncured adhesive layer 30 on target substrate 10 that is processed (forming processed adhesive 32) to increase the viscosity of the uncured adhesive layer 30 during reflow and consequently components 20 do not substantially move during the hard-cure process.

The demonstrations of FIGS. 19, 20A, 21A, and 22A are done with an uncured adhesive layer 30 (Intervia 8023) having a thickness of two microns, a planarization (soft-cure step 315) performed at 140 degrees C. for four minutes, and micro-transfer printed components 20, including LEDs and integrated logic circuits. The uncured adhesive 30 processing (step 330) for demonstrations shown in FIGS. 20B, 21B, and 22B was an ultra-violet light flood (unpatterned) exposure at 365 nm and 350 mJ/cm². Such a UV exposure is non-conventional in that traditional processing would only use heat to hard cure adhesive without using any such UV exposure. The effective radiation necessary for processing can vary. In some embodiments, it is only necessary to release some catalyst in the adhesive to affect reflow. Thus, thinner layers (e.g., 0.5 microns or 1.3 microns) to two microns can require less radiation (lower power, for example 100 mJ/cm² or 200 mJ/cm²) and thicker layers (e.g., 2.5 to 4 or 5 microns) can require more radiation. It is not necessary that all of the catalyst in the adhesive is released, only enough to affect reflow. Thus embodiments can use less radiation, even with thicker layers of adhesive. Once all of the catalyst is released, additional exposure has no effect, so there is no upper limit to a useful exposure. Moreover, some catalyst can be released in the adhesive even if the wavelength of the ultraviolet exposure is not exactly at the desired frequency, for example wavelengths of 200-425 nm can be effective.

Embodiments of the present disclosure provide advantages in that very small components 20 can be micro-assembled on a target substrate 10 with excellent registration and good electrical connections to other electrical devices disposed on target substrate 10. Such small components 20 provide cost-effective source wafer utilization. Furthermore, small components 20 can enable a dense, complex, and efficient use of target substrate 10 area. Thin components 20 can have a reduced step height over target substrate 10 (e.g., no greater than ten, five, two, or one microns) enabling thin-film interconnections 28 instead of requiring bond wires (e.g., wire bonds) to electrically connect components 20. Bond wires can require larger component contact pads 26 (undesirably increasing component 20 size), can have reduced electrical conductivity, and can increase electro-magnetic interference compared to thin-film interconnections 28 (e.g., electrodes 28) of the present disclosure (e.g., because bond wires can act as antennae).

In general, and without limiting embodiments of the present disclosure, curable polymer adhesives (such as Intervia 8023) suitable for adhering components 20 to target substrate 10, reflowing, and hard curing have a thickness dependency on reflow and hard-cure temperatures. Reflow can be accomplished, for example, at a temperature of 140 degrees C. for a period of four minutes for an uncured adhesive layer 30 thickness of two microns to thirty nm (e.g., approximately one micron or one-to-two microns). In some embodiments, a thinner uncured adhesive layer 30 thickness can reflow at lower temperatures. Similarly, thicker uncured adhesive layer 30 thicknesses can reflow at higher temperatures for greater periods of time without hard curing.

Effective hard curing of uncured adhesive layer 30 can also depend on uncured adhesive layer 30 thickness. For example, a hard thermal cure can be performed at 200 degrees C. for 60 minutes or 175 degrees C. for three hours. In contrast, reflow temperatures can be, for example, less than 200 degrees C. (e.g., 180, 170, 160, 140, or 120 degrees) for periods less than 60 minutes (e.g., less than or about fifteen, ten, five, four, three, two, or one minutes). Thicker layers can require greater temperatures, longer periods of time, or both. Moreover, polymer adhesives can begin to hard cure at lower temperatures (e.g., reflow temperatures), if held at the lower temperature for an extended period of time, for example due to slow kinetics but sufficient activation energy at such temperatures. Thus, according to some embodiments of the present disclosure, a reflow temperature is a temperature at which a given layer of uncured adhesive layer 30 substantially reflows for a predetermined period of time before substantially beginning to hard cure and substantially inhibiting reflow. Thus, reflow temperature is generally material, temperature, time period, and layer-thickness dependent but, in any case, does not perform a hard cure that permanently fixes the adhesive. Similarly, processing does not refer to a hard-cure thermal process. Processing can employ radiation exposure, a catalyst release in the adhesive, or a cross-link process, for example for a time and temperature less than necessary for a hard cure. Processing can include thermal treatment that is done at a temperature and for a time less than necessary for a hard cure.

Redistribution layer (RDL) methods for constructing thin-film interconnections 28 (e.g., electrodes 28) that extend over non-post components 20 to electrically contact and electrically connect with component contact pads 26 are effective for step heights compatible with non-post components 20 comprising unpackaged, bare die (e.g., no greater than fifty, twenty, ten, five, two, or one micron(s) thick). Some such methods rely on patterning a seed layer and then plating (e.g., electroplating or electro-less plating) the seed layer to form thin-film interconnections 28 (e.g., electrodes 28).

Target substrate 10 can be any destination substrate or target substrate 10 to which components 20 are transferred (e.g., by micro-transfer printing). For example, flat-panel display substrates, printed circuit boards, semiconductor or photolithographic wafers, or similar substrates can be used in various embodiments. Target substrates 10 can be found in the integrated circuit or display industries, for example substrates comprising one or more of glass, polymer (e.g., plastic, polyimide, PEN, or PET), resin, quartz, ceramic, metal (e.g., metal foil), semiconductor (such as silicon), a compound semiconductor, and sapphire. Target substrates 10 can be semiconductor substrates, for example silicon or compound semiconductor substrates. In certain embodiments, a target substrate 10 has a thickness in a range of from five microns to twenty mm (e.g., five to ten microns, ten to twenty microns, twenty to fifty microns, fifty to one hundred microns, one hundred to two hundred microns, two hundred to five hundred microns, five hundred to one thousand microns, one mm to five mm, five mm to ten mm, or ten mm to twenty mm).

Target substrate 10 (e.g., a destination substrate, system substrate, or any substrate on which components 20 can be usefully assembled) can be constructed using photolithographic methods and materials known in the art. Target substrate 10 can comprise a substrate circuit (e.g., an electronic circuit) used to control or respond to component 20, for example component 20 and component circuit 23 can be electrically connected to a substrate circuit formed in or on target substrate 10, for example a CMOS circuit. In some embodiments, target substrate 10 is a semiconductor substrate and comprises an electronic substrate circuit. Electronic substrate circuits can be electrically connected through electrodes 28 (e.g., thin-film interconnections 28) to control, provide signals to, or respond to component 20.

Components 20 can be any transfer-printable element, for example including any one or more of a wide variety of active or passive (or active and passive) components 20 (e.g., devices or subcomponents). Components 20 can comprise electronic component circuits 23 electrically connected to electrodes 28 that operate component 20. Component 20 can be responsive to electrical energy, to optical energy, to electromagnetic energy, or to mechanical energy, or a combination thereof, for example. In some embodiments, an electro-optic device comprises component 20 or component 20 comprises an optoelectronic device. Components 20 can be or include any one or more of an integrated device, an integrated circuit (such as a CMOS circuit), a light-emitting diode, a photodiode, a sensor, an electrical or electronic device, an optical device, an optoelectronic device, a magnetic device, a magneto-optic device, a magneto-electronic device, and a piezo-electric device, material or structure. In some embodiments, components 20 (e.g., post components 22) are light emitters, for example are each one or more of a light-emitting diode, a laser, a diode laser, a vertical-cavity surface-emitting laser, a micro-laser, a micro-light-emitting diode, an organic light-emitting diode, an inorganic light-emitting diode, a quantum-dot based light emitter, and a super-luminescent diode. In some embodiments, components 20 (e.g., non-post components 20) are integrated circuits, such as, for example, a controller (e.g., micro-controller), a driver, a driving circuit, a memory, or a combination thereof.

Components 20 (e.g., either or both of post components 22 and non-post components 20) formed or disposed in or on component source wafers can be constructed using integrated circuit, micro-electro-mechanical, or photolithographic methods and materials known in the art. Components 20 can be micro-devices constructed at micron-scale, for example having an extent (e.g., having at least one of a length and a width in a lateral dimension L substantially parallel to target-substrate surface 11) no greater than one thousand microns in length or width or both (e.g., no greater than five hundred, two hundred fifty, two hundred, one hundred, fifty, twenty five, twenty, fifteen, ten, five, two, or one microns) and a thickness (or height) over target substrate 10 no greater than two hundred microns (e.g., no greater than one hundred microns, fifty microns, twenty five microns, twenty microns, fifteen microns, ten microns, five microns, four microns, three microns, two microns, or one micron). Such small components 20 are susceptible to movement during uncured adhesive 30 reflow because they have little mass and forces other than gravity (such as surface energies, fluid surface tension, and wicking) can have a relatively large influence on component 20 movement. In contrast, the presence of connection posts 24 on post components 22 can increase vertical uncured adhesive 30 wicking and reduce horizontal post component 22 movement over target substrate 10.

Components 20 can comprise one or more different component materials, for example non-crystalline (e.g., amorphous), polycrystalline, or crystalline semiconductor materials such as silicon or compound semiconductor materials or non-crystalline or crystalline piezo-electric materials. In some embodiments, component 20 comprises a layer of dielectric material, for example an oxide or nitride such as silicon dioxide or silicon nitride.

Components 20 (e.g., either or both of post component 22 or non-post component 20) are generally non-native to target substrate 10, e.g., constructed on a separate native component source wafer and transferred to target substrate 10, for example by transfer printing or micro-transfer printing. In certain embodiments, components 20 can be native to and formed on sacrificial portions of component source wafers and can include seed layers for constructing crystalline layers on or in component source wafers. Components 20, sacrificial portions, anchors, and component tethers 21 can be constructed, for example using photolithographic processes known in the display, integrated circuit, or photonic industries.

Components 20 can be unpackaged dice (each an unpackaged die) that, in some embodiments, are transferred directly from one or more (e.g., native) component source wafers on or in which components 20 are constructed to target substrate 10. Anchors and component tethers 21 can each be or can comprise portions of a native component source wafer that are not sacrificial portions and can include layers formed on component source wafers, for example dielectric or metal layers and for example layers formed as a part of photolithographic processes used to construct or encapsulate components 20.

Components 20, in certain embodiments, can be constructed using foundry fabrication processes used in the art. Layers of materials can be used, including materials such as metals, oxides, nitrides and other materials used in the integrated-circuit arts. Each component 20 can be or include a complete semiconductor integrated circuit and can include, for example, any combination of one or more of a transistor, a diode, a light-emitting diode, and a sensor. Components 20 can have different sizes, for example, at least fifty square microns (e.g., at least one hundred square microns, at least one thousand square microns, at least ten thousand square microns, at least one hundred thousand square microns, or at least one square mm). Alternatively, or additionally, components 20 can be no more than one hundred square microns (e.g., no more than one thousand square microns, no more than ten thousand square microns, no more than one hundred thousand square microns, or no more than one square mm). Components 20 can have variable aspect ratios, for example from 1:1 to 10:1 (e.g., 1:1, 2:1, 5:1, or 10:1). Components 20 can be rectangular or can have other shapes, such as polygonal or circular shapes for example.

Uncured adhesive 30 (e.g., a layer of uncured adhesive 30 or an uncured adhesive layer 30) can comprise a polymer adhesive, for example Intervia 8023, and can have a thickness over target substrate 10 no greater than one micron, five hundred nm, two hundred fifty nm, one hundred nm, sixty nm, fifty nm, thirty nm, twenty nm, ten nm, or five nm. Uncured adhesive layer 30 can be a curable adhesive deposited in a liquid state, e.g., by spin or spray coating, and then cured. In some embodiments, uncured adhesive layer 30 is substantially transparent to light that is received or emitted by components 20. (Target substrate 10 can also be substantially transparent to such light.) A substantially transparent uncured adhesive layer 30 is one that does not compromise the effective transmission of light received or emitted by components 20, for example an uncured adhesive layer 30 comprising an adhesive that is at least 50%, e.g., at least 75%, at least 80%, at least 85%, at least 90%, or at least 95% transparent to light received or emitted by components 20.

According to some embodiments of the present disclosure, an uncured adhesive 30 (uncured adhesive layer 30) such as an epoxy or resin is disposed on target-substrate surface 11 of target substrate 10, for example by spray, slot, curtain, or spin coating. Uncured adhesive 30 can be disposed between component 20 and target-substrate surface 11 to adhere component 20 to target-substrate surface 11 and thereby facilitate micro-transfer printing component 20 onto target-substrate surface 11 and cured (e.g., hard cured) to prevent component 20 from moving with respect to target-substrate surface 11 when subject to mechanical or thermal stress.

Uncured adhesive 30 is described in various embodiments as being, inter alia, separated from component 20, on target substrate 10, beneath component 20, and between component 20 and target substrate 10. It should be understood that unless accompanied by the word "solely" or "exclusively" or a similar word, at least a portion of uncured adhesive 30 can be disposed as described while a portion, or in some embodiments none, of uncured adhesive 30 is disposed elsewhere. For example, when uncured adhesive 30 is described as being disposed between component 20 and target substrate 10, it should be understood that some of uncured adhesive 30 can be, but is not necessarily, disposed on target substrate 10 and not between component 20 and target substrate 10 (e.g., uncured adhesive 30 extends along target substrate 10 beyond a perimeter of component 20 in at least one direction). For embodiments described that include uncured adhesive 30 and where the word "solely" or "exclusively" or a similar word was not used in such description, additional analogous embodiments where uncured adhesive 30 is disposed solely/exclusively as described (e.g., between component 20 and target substrate 10) are also contemplated. (Solely and exclusively are used interchangeably in this context with respect to uncured adhesive 30.)

In some embodiments, an uncured adhesive layer 30 of adhesive, such as a layer of resin, polymer, or epoxy, either curable or non-curable, adheres components 20 onto target substrate 10 and can be disposed, for example by coating or lamination. In some embodiments, an uncured adhesive layer 30 is disposed in a pattern, for example disposed in locations on target substrate 10 where components 20 are to be printed (e.g., micro-transfer printed). A patterned layer of uncured adhesive 30 can be disposed using inkjet, screening, or photolithographic techniques, for example. In some embodiments, uncured adhesive 30 is coated, for example with a spray or slot coater, and then patterned, for example using photolithographic techniques. If uncured adhesive 30 is disposed over at least a portion of target-substrate surface 11 of target substrate 10, a component 20 disposed on uncured adhesive 30 is also said to be disposed on target-substrate surface 11.

A transfer element, e.g., for micro-transfer printing, can be a viscoelastic stamp with one or more stamp posts. In the present disclosure, for simplicity and clarity a stamp is referred to interchangeably with a transfer element, but the transfer element is not limited to a stamp embodiment. Certain embodiments of the present disclosure contemplate and include transfer elements other than stamps, for example vacuum, magnetic, and electro-static grippers that are used to print components 20 to target substrate 10.

Some methods of the present disclosure accomplish component 20 transfers using micro-transfer printing (e.g., dry contact printing). Micro-transfer printing is especially useful when transferring or otherwise disposing components 20 that are relatively small, for example constructed at a micron scale. Such printing methods can transfer components 20 formed on a native component source substrate to a destination or target substrate 10. In some embodiments, the component source substrate is processed to release components 20 from the component source substrate so that components 20 are physically attached to the component source substrate only with one or more component tethers 21 physically connecting components 20 to one or more anchors of the component source substrate. A transfer element (e.g., a stamp) contacts one or more components 20, adhering component 20 to the stamp (for example, to a stamp post). The stamp separates and removes components 20 from the component source wafer, breaking (e.g., fracturing) or separating each component tether 21 physically connecting each component 20 to an anchor portion of the native component source wafer. The stamp then contacts the one or more components 20 adhered to corresponding stamp posts to a target substrate 10 (e.g., to uncured adhesive layer 30 coated on target-substrate surface 11.

Reference is made throughout the present description to examples of printing that are micro-transfer printing with a stamp comprising a stamp post when describing certain examples of printing components 20. Similar other embodiments are expressly contemplated where a transfer element that is not a stamp is used to similarly print components 20. For example, in some embodiments, a transfer element that is a vacuum-based, magnetic, or electrostatic transfer element can be used to print components 20. A component 20 can be adhered to a transfer element with any type of force sufficient to maintain contact between component 20 and the transfer element when desired and separate transfer element from component 20 when desired. For example, component 20 can be adhered to the transfer element with one or more of an adhesion, electrostatic, van der Waals, magnetic, or vacuum force. In some embodiments, adhesion between component 20 and the transfer element occurs at least in part due to a force generated by operating the transfer element (e.g., an electrostatic force) and separation of the transfer element from component 20 occurs at least in part by ceasing provision of the force (e.g., an electrostatic force). A vacuum-based, magnetic, or electrostatic transfer element can comprise a plurality of transfer posts, each transfer post being constructed and arranged to pick up a single component 20 (similarly to stamp posts in a stamp).

According to some embodiments, micro-transfer printing can include any method of transferring components 20 from a component source wafer (e.g., a native source wafer) to a target substrate 10 by contacting components 20 on the component source wafer with a patterned or unpatterned stamp surface of a stamp (e.g., a distal end of a stamp post), removing (e.g., separating) components 20 from the component source wafer, transferring the stamp and contacted components 20 to target substrate 10, and contacting components 20 to target-substrate surface 11 of target substrate 10, for example uncured adhesive layer 30 by moving the stamp or target substrate 10. Components 20 can be adhered to the stamp or target substrate 10 by, for example, van der Waals forces, electrostatic forces, magnetic forces, chemical forces, adhesives, or any combination of the above. In some embodiments, components 20 are adhered to the stamp with separation-rate-dependent adhesion, for example kinetic control of viscoelastic stamp materials such as can be found in elastomeric transfer elements or transfer devices such as a PDMS stamp. The stamps can be patterned or unpatterned and can comprise stamp posts having a stamp post area on the distal end of the stamp posts. The stamp posts can have a length, a width, or both a length and a width, similar or substantially equal to a length, a width, or both a length and a width of component 20.

In exemplary methods, a viscoelastic elastomer (e.g., PDMS) stamp (e.g., comprising a plurality of stamp posts) is constructed and arranged to retrieve and transfer arrays of components 20 from their native component source wafer onto non-native patterned target substrates 10. In some embodiments, the stamp mounts onto motion-plus-optics machinery (e.g., an opto-mechatronic motion platform) that can precisely control the stamp alignment and kinetics with respect to both component source wafers and target substrates 10. During micro-transfer printing, the motion platform brings the stamp into contact with components 20 on the component source wafer, with optical alignment performed before contact. Rapid upward movement of the print-head (or, in some embodiments, downward movement of the component source wafer) breaks (e.g., fractures) or separates component tether(s) 21 forming broken (e.g., fractured) or separated component tethers 21, transferring component(s) 20 from native component source wafer to the stamp or stamp posts. The stamp populated with components 20 then travels to patterned target substrate 10 (or vice versa) and one or more components 20 are then aligned to target substrate 10 and printed.

A component source wafer can be any source wafer or substrate with (e.g., native) transfer-printable components 20 that can be transferred with a transfer element (e.g., a stamp). For example, a component source wafer can be or comprise a semiconductor (e.g., silicon) in a crystalline or non-crystalline form, a compound semiconductor (e.g., comprising GaN or GaAs), a glass, a polymer, a sapphire, or a quartz wafer. Sacrificial portions of native component source wafer enabling the release of components 20, for example by etching, can be formed of a patterned oxide (e.g., silicon dioxide) or nitride (e.g., silicon nitride) layer or can be an anisotropically etchable portion of a sacrificial layer of a component source wafer over which components 20 are disposed while also physically connected by component tether 21 to an anchor of the component source wafer. Typically, component source wafers are smaller than patterned target substrates 10 and can have a higher density of components 20 disposed thereon than components 20 disposed on target substrate 10.

Patterned electrical conductors (e.g., wires, traces, electrodes, and electrical contact pads) found on printed circuit boards, flat-panel display substrates, and in thin-film circuits can be formed on any combination of components 20 and target substrate 10, and any one can comprise electrical conductors such as wires 14 or electrical contact pads (e.g., target-substrate contact pads 12 and component contact pads 26) that electrically connect to components 20 or component circuits 23. Such patterned electrical conductors and electrodes (e.g., contact pads) can comprise, for example, metal, transparent conductive oxides, or cured conductive inks and can be constructed using photolithographic methods and materials, for example metals such as aluminum, gold, or silver deposited by evaporation and patterned using patternwise exposed, cured, and etched photoresists, or constructed using imprinting methods and materials or inkjet printers and materials, for example comprising cured conductive inks deposited on a target-substrate surface 11 or provided in micro-channels in or on target substrate 10.

Examples of micro-transfer printing processes suitable for disposing components 20 onto target substrates 10 are described in *Inorganic light-emitting diode displays using micro-transfer printing* (Journal of the Society for Information Display, 2017, DOI #10.1002/jsid.610, 1071-0922/17/2510-0610, pages 589-609), U.S. Pat. No. 8,722,458 entitled Optical Systems Fabricated by Printing-Based Assembly, U.S. Pat. No. 10,103,069 entitled Pressure-Activated Electrical Interconnection by Micro-Transfer Printing, U.S. Pat. No. 8,889,485 entitled Methods for Surface Attachment of Flipped Active Components, U.S. Pat. No. 10,468,363 entitled Chiplets with Connection Posts, U.S. Pat. No. 10,224,460 entitled Micro-Assembled LED Displays and Lighting Elements, and U.S. Pat. No. 10,153,256, entitled Micro-Transfer Printable LED Component, the disclosure of each of which is incorporated herein by reference in its entirety.

For a discussion of various micro-transfer printing techniques, see also U.S. Pat. Nos. 7,622,367 and 8,506,867, each of which is hereby incorporated by reference in its entirety. Micro-transfer printing using compound micro-assembly structures and methods can also be used in certain embodiments, for example, as described in U.S. patent application Ser. No. 14/822,868, filed Aug. 10, 2015, entitled Compound Micro-Assembly Strategies and Devices, which is hereby also incorporated by reference in its entirety. In some embodiments, target substrate 10 and components 20 comprise a compound micro-assembled structure (e.g., a compound micro-assembled macro-system). Components 20 can each be a micro-system.

According to various embodiments, a component source wafer (e.g., a native component source wafer) can be provided with components 20, patterned sacrificial portions, component tethers 21, and anchors already formed, or they can be constructed as part of a method in accordance with certain embodiments. Component source wafers and components 20, a transfer element (e.g., a stamp), and target substrate 10 can be made separately and at different times or in different temporal orders or locations and provided in various process states.

The spatial distribution of any one or more of components 20 on target substrate 10 is a matter of design choice for the end product desired. In some embodiments, all components 20 in an array on a component source wafer are transferred to a transfer element. In some embodiments, a subset of components 20 in an array on a native component source wafer is transferred. By varying the number and arrangement of stamp posts on transfer stamps, the distribution of components 20 on the stamp posts of a transfer stamp can be likewise varied, as can the distribution of components 20 on target substrate 10.

Because components 20, in certain embodiments, can be made using integrated circuit photolithographic techniques having a relatively high resolution and cost and target substrate 10, for example a printed circuit board, can be made using printed circuit board techniques having a relatively low resolution and cost, electrical conductors (e.g., electrodes) can be much larger than electrical contacts or component electrodes 28 on component 20, thereby reducing manufacturing costs. For example, in certain embodiments, printable component 20 has at least one of a width, length, and height from one-half microns to two hundred microns (e.g., one-half to two microns, two to five microns, five to ten microns, ten to twenty microns, twenty to fifty microns, fifty to one hundred microns, or one hundred to two hundred microns).

Various embodiments of structures and methods are described herein. Structures and methods were variously described as transferring components 20, printing components 20, or micro-transferring components 20. In some embodiments, micro-transfer-printing involves using a transfer element (e.g., an elastomeric stamp, such as a PDMS stamp) to transfer a component 20 using controlled adhesion. For example, an exemplary transfer device can use kinetic or shear-assisted control of adhesion between a transfer element and a component 20. It is contemplated that, in certain embodiments, where a method is described as including printing (e.g., micro-transfer-printing) a component 20, other similar embodiments exist using a different transfer method. In some embodiments, transferring or printing a component 20 (e.g., from a native component source substrate or wafer to a destination patterned target substrate 10) can be accomplished using any one or more of a variety of known techniques. For example, in certain embodiments, a pick-and-place method can be used to print components 20 or structures 20. As another example, in certain embodiments, a flip-chip method can be used (e.g., involving an intermediate, handle or carrier substrate). In methods according to certain embodiments, a vacuum tool, an electro-static tool, a magnetic tool, or other transfer device is used to transfer a component 20.

As is understood by those skilled in the art, the terms "over" and "under" are relative terms and can be interchanged in reference to different orientations of the layers, elements, and substrates included in various embodiments of the present disclosure. Furthermore, a first layer or first element "on" a second layer or second element, respectively, is a relative orientation of the first layer or first element to the second layer or second element, respectively, that does not preclude additional layers being disposed therebetween. For example, a first layer on a second layer, in some implementations, means a first layer directly on and in contact with a second layer. In other implementations, a first layer on a second layer includes a first layer and a second layer with another layer therebetween (e.g., and in mutual contact).

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific elements, or where processes and methods are described as having, including, or comprising specific steps, it is contemplated that, additionally, there are apparatus and systems of the disclosed technology that consist essentially of, or consist of, the recited elements, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The disclosure has been described in detail with particular reference to certain embodiments thereof, but it will be understood that variations and modifications can be effected within the spirit and scope of the following claims.

PARTS LIST

A cross section line
L lateral direction/horizontal direction
10 target substrate
11 target-substrate surface
12 target-substrate contact pad
14 wire
16 alignment marks
20 non-post component/component without connection post/second component/component
21 component tether
22 post component/component with connection post/first component/component
23 component circuit
24 connection post/spike
26 component contact pad
28 electrode/thin-film interconnection/RDL connection
29 patterned dielectric structure
30 uncured adhesive/uncured adhesive layer/layer of uncured adhesive
32 processed adhesive/second adhesive portion/second portion
34 reflowed adhesive
35 unprocessed adhesive/first adhesive portion/first portion
36 cured adhesive/cured adhesive layer/hard-cured adhesive
40 radiation
41 mask
42 mask opening
100 provide target substrate with contact pads step
110 coat adhesive on target substrate step
120 print devices with spikes step
130 print devices without spikes step
140 expose adhesive through mask step
150 reflow adhesive step
160 optional cool target substrate step
170 cure adhesive step
180 optional field etch step
190 pattern electrode step
200 provide component source substrate step
210 provide stamp step
220 pick up components with stamp step
230 print components onto target substrate with stamp step
240 remove stamp step
300 provide target substrate step
310 coat adhesive on target substrate step
315 optional soft-cure adhesive step
320 print components step
330 expose adhesive step
340 cure adhesive step
350 optional field etch step
360 pattern electrode step

What is claimed:

1. A method of making a printed structure, the method comprising:
   disposing a first component to a target substrate coated with an uncured adhesive;
   disposing a second component to the target substrate;
   pattern-wise processing the uncured adhesive so that a first portion of the uncured adhesive adjacent to the first component is not processed and a second portion of the uncured adhesive adjacent to the second component is processed;
   reflowing the unprocessed first portion of the uncured adhesive; and
   curing the uncured adhesive.

2. The method of claim 1, wherein the target substrate comprises a target-substrate contact pad and the first component is a post component comprising an electrical connection extending from the post component toward the target-substrate contact pad.

3. The method of claim 2, wherein the electrical connection is in contact with the target-substrate contact pad after the curing.

4. The method of claim 1, wherein the second component is a non-post component and is laterally displaced from the first component with respect to the target substrate.

5. The method of claim 1, wherein processing the second portion of the uncured adhesive comprises exposing the second portion of the adhesive to electromagnetic radiation through a mask.

6. The method of claim 1, wherein processing the second portion of the uncured adhesive comprises releasing a catalyst in the exposed second portion of the adhesive.

7. The method of claim 1, wherein processing the second portion of the adhesive diminishes a capacity of the second portion of the adhesive to reflow.

8. The method of claim 1, wherein reflowing the first portion of the adhesive moves the first component closer to the target substrate.

9. The method of claim 1, wherein curing the adhesive moves the first component closer to the target substrate and moves the second component closer to the target substrate.

10. The method of claim 1, comprising removing exposed adhesive that is not between the first component and the target substrate and is not between the second component and the target substrate.

11. The method of claim 1, wherein (i) disposing the first component comprises micro-transfer printing the first component onto the adhesive over the target substrate or (ii) disposing the second component comprises micro-transfer printing the second component onto the adhesive over the target substrate, or (iii) both (i) and (ii).

12. The method of claim 1, wherein the first component, the second component, or both the first component and the second component, has or have a lateral dimension no greater than 200 microns.

13. The method of claim 1, wherein (i) the first component comprises a broken or separated tether, (ii) the second component comprises a broken or separated tether, or (iii) both the first component and the second component comprise a broken or separated tether.

14. The method of claim 1, wherein the second portion of the uncured adhesive at least partially laterally surrounds the second component and/or laterally interposes between the first component and the second component.

15. A printed structure, comprising:

a target substrate;

uncured adhesive disposed over the target substrate and the target-substrate contact pad;

a first component disposed on the uncured adhesive over the target-substrate contact pad; and a second component disposed on the uncured adhesive and laterally displaced from the first component, wherein a first portion of the uncured adhesive adjacent to the first component has not been processed and a second portion of the uncured adhesive adjacent to the second component has been processed.

16. The printed structure of claim 15, wherein the target substrate comprises a target-substrate contact pad, the uncured adhesive is disposed over the target-substrate contact pad, and the first component comprises an electrical connection extending from the first component toward the target-substrate contact pad.

17. The printed structure of claim 15, wherein the first component or the second component, both the first component and the second component, has or have a lateral dimension no greater than 200 microns.

18. The printed structure of claim 15, wherein (i) the first component comprises a broken or separated tether, (ii) the second component comprises a broken or separated tether, or (iii) both the first component and the second component comprise a broken or separated tether.

19. The printed structure of claim 15, wherein the processed second portion of the uncured adhesive has a reduced capacity to reflow compared to the first portion of the uncured adhesive.

20. The printed structure of claim 15, wherein the processed second portion of the uncured adhesive laterally surrounds.

\*    \*    \*    \*    \*